(12) United States Patent
Kitaoka et al.

(10) Patent No.: US 7,176,115 B2
(45) Date of Patent: *Feb. 13, 2007

(54) METHOD OF MANUFACTURING GROUP III NITRIDE SUBSTRATE AND SEMICONDUCTOR DEVICE

(75) Inventors: Yasuo Kitaoka, Ibaraki (JP); Hisashi Minemoto, Hirakata (JP); Isao Kidoguchi, Kawanishi (JP); Akihiko Ishibashi, Mishima-gun (JP); Takatomo Sasaki, Suita (JP); Yusuke Mori, 8-16-9, Kisaichi, Katano-shi, Osaka (JP) 576-0033; Fumio Kawamura, Minoh (JP)

(73) Assignees: Matsushita Electric Industrial Co., Ltd., Osaka (JP); Yusuke Mori, Osaka (JP)

( * ) Notice: Subject to any disclaimer, the term of this patent is extended or adjusted under 35 U.S.C. 154(b) by 28 days.

This patent is subject to a terminal disclaimer.

(21) Appl. No.: 10/804,610

(22) Filed: Mar. 18, 2004

(65) Prior Publication Data
US 2004/0183090 A1    Sep. 23, 2004

(30) Foreign Application Priority Data
Mar. 20, 2003   (JP)  .............. 2003-078814
May 29, 2003    (JP)  .............. 2003-153236

(51) Int. Cl.
*H01L 21/38*   (2006.01)
*H01L 21/22*   (2006.01)

(52) U.S. Cl. .................. 438/557; 438/22; 438/46; 438/538; 257/103; 257/E21.132

(58) Field of Classification Search ............ 438/22, 438/557
See application file for complete search history.

(56) References Cited

U.S. PATENT DOCUMENTS 5,868,837 A    2/1999   DiSalvo et al. ............. 117/952

(Continued)

FOREIGN PATENT DOCUMENTS

JP    2000-357663    12/2000

(Continued)

OTHER PUBLICATIONS

Kawamura, et al., "Growth of a Large GaN Single Crystal Using the Liquid Phase Epitaxy (LPE) Technique", Jpo. J. Appl. Phys., vol. 42, part 2, No. 1A/B, Jan. 15, 2003, pp. L4-L6.

*Primary Examiner*—Tu-Tu Ho
(74) *Attorney, Agent, or Firm*—Hamre, Schumann, Mueller & Larson, P.C.

(57) ABSTRACT

The present invention provides a manufacturing method that allows a Group III nitride substrate with a low dislocation density to be manufactured, and a semiconductor device that is manufactured using the manufacturing method. The manufacturing method includes, in an atmosphere including nitrogen, allowing a Group III element and the nitrogen to react with each other in an alkali metal melt to cause generation and growth of Group III nitride crystals. In the manufacturing method, a plurality of portions of a Group III nitride semiconductor layer are prepared, selected as seed crystals, and used for at least one of the generation and the growth of the Group III nitride crystals, and then surfaces of the seed crystals are brought into contact with the alkali metal melt.

58 Claims, 12 Drawing Sheets

U.S. PATENT DOCUMENTS

| | | |
|---|---|---|
| 6,121,121 A | 9/2000 | Koide ........................ 438/481 |
| 6,270,569 B1* | 8/2001 | Shibata et al. ................. 117/68 |
| 6,503,610 B2 | 1/2003 | Hiramatsu et al. .......... 428/210 |
| 6,592,663 B1* | 7/2003 | Sarayama et al. ............. 117/68 |
| 6,667,252 B2 | 12/2003 | Miyajima et al. ........... 438/796 |
| 2003/0042496 A1* | 3/2003 | Sasaoka ....................... 257/102 |
| 2004/0124434 A1* | 7/2004 | D'Evelyn et al. ........... 257/103 |
| 2004/0147096 A1* | 7/2004 | Kitaoka et al. ............. 438/483 |
| 2005/0011432 A1* | 1/2005 | Kitaoka et al. ................ 117/54 |
| 2005/0082564 A1 | 4/2005 | Kitaoka et al. ............. 257/103 |

FOREIGN PATENT DOCUMENTS

| | | |
|---|---|---|
| JP | 2002-293696 | 10/2002 |
| JP | 3409576 | 3/2003 |
| WO | 2004/013385 | 2/2004 |

\* cited by examiner

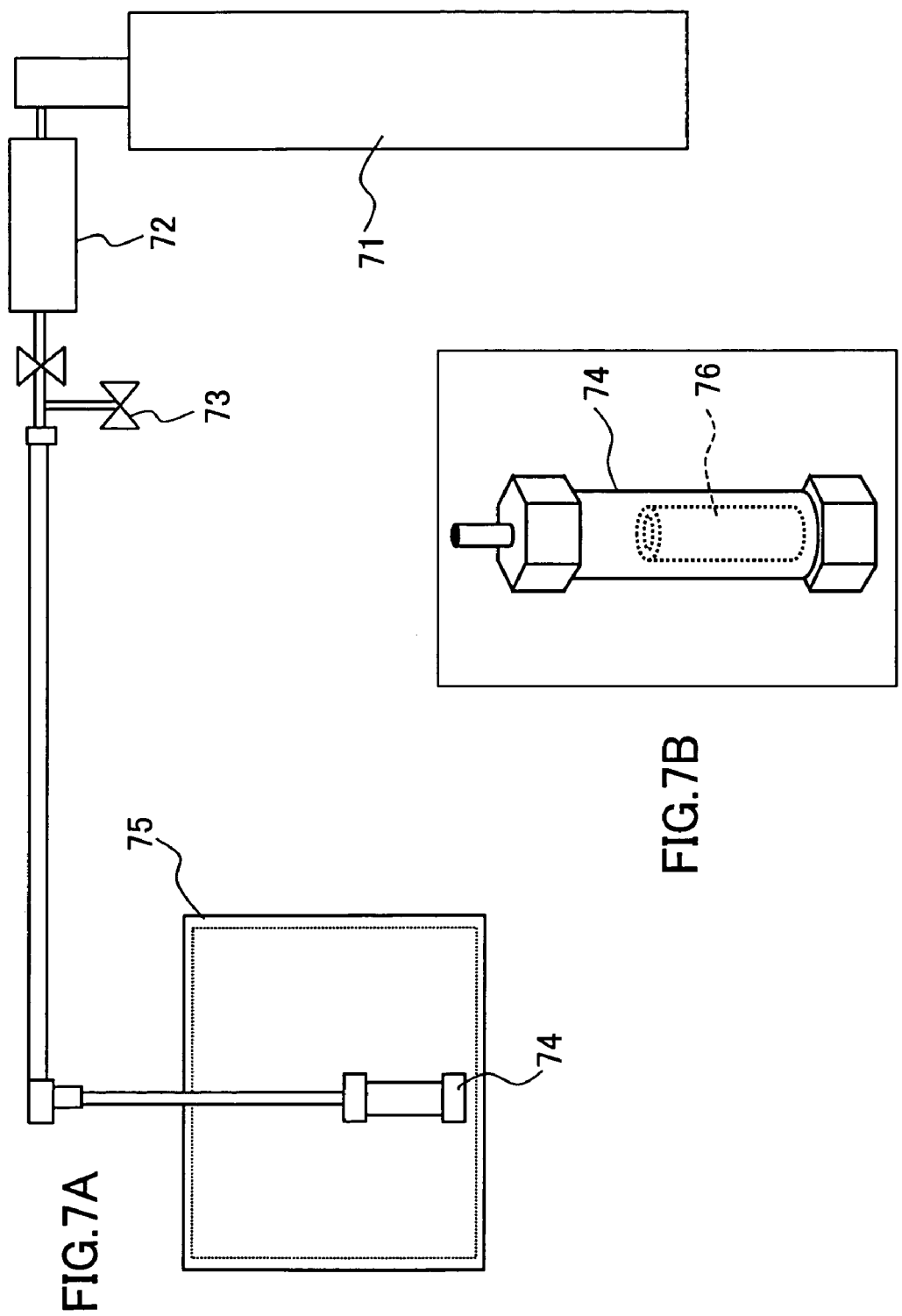

METHOD OF MANUFACTURING GROUP III NITRIDE SUBSTRATE AND SEMICONDUCTOR DEVICE

BACKGROUND OF THE INVENTION

1. Field of the Invention

The present invention relates generally to a method of manufacturing a Group III nitride substrate (a substrate including Group III nitride semiconductor crystals), and a semiconductor device.

2. Related Background Art

A Group III nitride compound semiconductor such as, for instance, gallium nitride (GaN) (hereinafter also referred to as a "Group III nitride semiconductor" or a "GaN-based semiconductor") has been gaining attention as a material for semiconductor elements that emit blue or ultraviolet light. A laser diode (LD) that emits blue light is used for high-density optical disk devices or displays while a light emitting diode (LED) that emits blue light is used for displays, lighting, etc. It is expected to use an ultraviolet LD in the field of biotechnology or the like and an ultraviolet LED as an ultraviolet source for a fluorescent lamp.

Generally, substrates of a Group III nitride semiconductor (for example, GaN) that are used for LDs or LEDs are formed through vapor phase epitaxy. For instance, they are formed through heteroepitaxial growth of Group III nitride crystals on a sapphire substrate. However, the sapphire substrate and the GaN crystals are different from each other in lattice constant by 13.8% and in coefficient of linear expansion by 25.8%. Hence, a sufficiently high crystallinity cannot be obtained in the GaN thin film obtained through the vapor phase epitaxy. Generally, crystals obtained by this method have a dislocation density of $10^8$ cm$^{-2}$ to $10^9$ cm$^{-2}$ and thus the reduction in dislocation density has been an important issue. In order to resolve this issue, efforts have been made to reduce the dislocation density and thereby, for example, an epitaxial lateral overgrowth (ELOG) method has been developed. With this method, the dislocation density can be reduced to around $10^5$ cm$^{-2}$ to $10^6$ cm$^{-2}$, but the manufacturing process is complicated.

On the other hand, besides the vapor phase epitaxy, a method of carrying out crystal growth from a liquid phase also has been studied. However, since the equilibrium vapor pressure of nitrogen is at least 10000 atm ($10000 \times 1.013 \times 10^5$ Pa) at the melting point of Group III nitride single crystals such as, for instance, GaN or AlN, conventionally it has been understood that a condition of 8000 atm ($8000 \times 1.013 \times 10^5$ Pa) at 1200° C. is required for growing GaN from a liquid phase. In this connection, recently, it was made clear that GaN was able to be synthesized at relatively low temperature and pressure, specifically, 750° C. and 50 atm ($50 \times 1.013 \times 10^5$ Pa), by using a Na flux.

Recently, single crystals with the maximum crystal size of about 1.2 mm are obtained by a method in which a mixture of Ga and Na is melted in a nitrogen gas atmosphere containing ammonia at 800° C. and 50 atm ($50 \times 1.013 \times 10^5$ Pa), and then single crystals are grown for 96 hours using the melt (see, for instance, JP2002-293696A).

Furthermore, another method has been reported in which, after a GaN crystal layer is formed on a sapphire substrate through metalorganic chemical vapor deposition (MOCVD), single crystals are grown through liquid phase epitaxy (LPE).

Generally, for instance, a sapphire substrate is used for manufacturing a Group III nitride substrate. However, such a substrate and a Group III nitride crystal are different from each other in lattice constant and coefficient of thermal expansion. Hence, when Group III nitride crystals are grown using such a substrate, the substrate may be distorted or warped in some cases.

When a device is to be manufactured using a semiconductor substrate with low surface flatness, the manufacture may be difficult. For instance, mask alignment may be difficult, for example in the case of using a stepper to be employed in a device manufacturing process.

SUMMARY OF THE INVENTION

With such situations in mind, the present invention is intended to provide a manufacturing method that makes it possible to manufacture a Group III nitride substrate that has a low dislocation density and high surface flatness, and a semiconductor device that is manufactured using the same.

In order to achieve the above-mentioned object, the present invention provides a method of manufacturing a Group III nitride substrate that includes, in an atmosphere including nitrogen, allowing a Group III element and the nitrogen react with each other in an alkali metal melt to cause generation and growth of Group III nitride crystals. In the method, a plurality of portions of a Group III nitride semiconductor layer preformed on a base substrate are selected as seed crystals that are used for at least one of the generation and the growth of the Group III nitride crystals, and then surfaces of the seed crystals are brought into contact with the alkali metal melt.

In the manufacturing method of the present invention, the Group III nitride is used for the seed crystals and the Group III nitride crystals are grown selectively therefrom. Accordingly, a Group III nitride substrate having a large area with fewer dislocations can be manufactured readily.

BRIEF DESCRIPTION OF THE DRAWINGS

FIGS. 2A and 2B are diagrams showing a step of the manufacturing method of the present invention, wherein FIG. 2A is a plan view of an example while FIG. 2B is a plan view of another example.

FIGS. 7A and 7B are schematic views showing a configuration of an example of a manufacturing apparatus to be used in the manufacturing method of the present invention.

DETAILED DESCRIPTION OF THE INVENTION

Figure 1A:
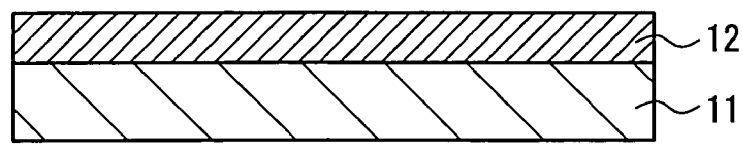
FIGS. 1A to 1C are cross-sectional views showing steps of an example of the manufacturing method according to the present invention.

Hereinafter, the manufacturing method of the present invention is described in detail using first to fourth manufacturing methods as examples. The present invention, however, is not limited thereto.

Preferably, a first manufacturing method of the present invention includes: (i) preparing a semiconductor layer that is expressed by a composition formula of $Al_uGa_vIn_{1-u-v}N$ (where $0 \leq u \leq 1$, $0 \leq v \leq 1$, and $u+v \leq 1$); (ii) forming a patterned mask film on the semiconductor layer; and (iii) in an atmosphere including nitrogen, bringing the surface of the semiconductor layer into contact with a melt containing the nitrogen, alkali metal, and at least one Group III element selected from gallium, aluminum, and indium, and thereby growing Group III nitride crystals on the semiconductor layer, with portions of the semiconductor layer that are not covered with the mask film serving as seed crystals. In this specification, the "Group III nitride crystals" denote crystals that are expressed by a composition formula of $Al_xGa_yIn_{1-x-y}N$ (where $0 \leq x \leq 1$, $0 \leq y \leq 1$, and $x+y \leq 1$).

Preferably, a second manufacturing method of the present invention includes: (I) forming a patterned mask film on a base substrate; (II) forming a semiconductor layer that is expressed by a composition formula of $Al_uGa_vIn_{1-u-v}N$ (where $0 \leq u \leq 1$, $0 \leq v \leq 1$, and $u+v \leq 1$), on portions of the base substrate that are not covered with the mask film; and (III) in an atmosphere including nitrogen, bringing a surface of the semiconductor layer into contact with a melt containing the nitrogen, alkali metal, and at least one Group III element selected from gallium, aluminum, and indium, and thereby growing Group III nitride crystals on the semiconductor layer, with the semiconductor layer serving as seed crystals.

Preferably, a third manufacturing method of the present invention includes: (A) preparing a semiconductor layer that is expressed by a composition formula of $Al_uGa_vIn_{1-u-v}N$ (where $0 \leq u \leq 1$, $0 \leq v \leq 1$, and $u+v \leq 1$); (B) oxidizing portions of a surface of the semiconductor layer to form oxidized regions; and (C) in an atmosphere including nitrogen, bringing the surface of the semiconductor layer into contact with a melt containing the nitrogen, alkali metal, and at least one Group III element selected from gallium, aluminum, and indium, and thereby growing Group III nitride crystals on the semiconductor layer, with portions other than the oxidized regions of the semiconductor layer serving as seed crystals.

Furthermore, preferably, a fourth manufacturing method of the present invention includes: (a) forming, on a base substrate, a semiconductor layer that is expressed by a composition formula of $Al_uGa_vIn_{1-u-v}N$ (where $0 \leq u \leq 1$, $0 \leq v \leq 1$, and $u+v \leq 1$); (b) forming a patterned mask film on the semiconductor layer, removing portions of the semiconductor layer located in regions that are not covered with the mask film, to expose corresponding portions of the base substrate and to form seed semiconductor layers with a convex shape that are covered with the mask film; and (c) in an atmosphere including nitrogen, bringing surfaces of the seed semiconductor layers into contact with a melt containing the nitrogen, alkali metal, and at least one Group III element selected from gallium, aluminum, and indium, and thereby growing Group III nitride crystals on the semiconductor layer, with the seed semiconductor layers serving as seed crystals.

In the first manufacturing method, for example, diamond-like carbon, alumina ($Al_2O_3$), or materials expressed by a composition formula of $Al_uGa_{1-u}N$ (where $0 \leq u \leq 1$) can be used for the mask film.

In the first manufacturing method, when a material that is expressed by a composition formula of $Al_uGa_{1-u}N$ (where $0 \leq u \leq 1$) is used for the mask film, it is preferable that a composition ratio of Al contained in the mask film is higher than that of Al contained in the semiconductor layer. Furthermore, it is preferable that the surface of the mask film or the mask film as a whole has been oxidized. The state where the mask film has been oxidized denotes the state where for instance, $GaO_x$, $AlO_x$, or $AlGaO_x$ has been formed in the mask film. Furthermore, the state where the surface of the mask film has been oxidized means, for instance, the state where a surface portion of the mask film has been oxidized that has a thickness of not more than half the thickness of the mask film. The oxidized regions of the mask film may partly include non-oxidized portions, for example, portions that are expressed by a composition formula of $Al_uGa_{1-u}N$ (where $0 < u \leq 1$).

The method of oxidizing the surface of the mask film is not particularly limited. Examples of the method include a thermal oxidation method in which a heat treatment is carried out in an atmosphere containing oxygen, a method in which oxygen ions are implanted, and a method in which a treatment is carried out with oxygen plasma. The regions where the surface of the mask film has been oxidized have a thickness of, for instance, 0.01 μm to 1.0 μm, preferably 0.05 μm to 0.5 μm. The thickness of the regions where the surface of the mask film has been oxidized can be measured with, for instance, a cross-sectional scanning electron microscope (SEM) or a cross-sectional transmission electron microscope (TEM).

In the first manufacturing method, it is preferable that the step (i) is forming, on a base substrate, a Group III nitride semiconductor layer that is expressed by a composition formula of $Al_uGa_vIn_{1-u-v}N$ (where $0 \leq u \leq 1$, $0 \leq v \leq 1$, and $u+v \leq 1$).

In the first manufacturing method, it is preferable that the semiconductor layer is formed using GaN, and the mask film is expressed by a composition formula of $Al_uGa_{1-u}N$ (where $0.05 \leq u \leq 1$).

In the first to fourth manufacturing methods, it is preferable that the mask film has a plurality of through holes formed therein. The "through holes" imply that, for instance, when the through holes are formed in the mask film, portions of the semiconductor layer that are located under the through holes are not covered with the mask film. Examples of the shape of each through hole viewed from its upper side include a dot shape and a stripe shape.

In the first to fourth manufacturing methods, it is preferable that the mask film is patterned into stripes. Accordingly, stripe-like portions of the semiconductor layer may be exposed.

With respect to the size of the through holes, for instance, when the shape of each through hole viewed from its upper side is a dot-like circular shape, the through holes each have a diameter of, for example, 1 μm to 1000 μm, preferably 10 μm to 500 μm. On the other hand, when the shape of each through hole viewed from its upper side is a stripe shape, the length of the through holes are not particularly limited, but the width of the through holes is, for example, in the range of 1 μm to 100 μm, preferably in the range of 5 μm to 30 μm.

In the manufacturing method of the present invention, it is preferable that the Group III nitride crystals are grown while the seed crystals is rocked in the melt.

In the first manufacturing method, it is preferable that the mask film is formed using Al, and a surface of the mask film or the mask film as a whole has been oxidized. The method of oxidizing the mask film is the same as in the above.

In the second manufacturing method, it is preferable that the mask film includes at least one selected from the group consisting of silicon nitride, silicon oxide, silicon nitride oxide, aluminum oxide, and aluminum nitride oxide.

In the second manufacturing method, it is preferable that the mask film includes at least one of high melting metal or a high melting metallized material.

In the second manufacturing method, it is preferable that the mask film includes at least one selected from the group consisting of titanium, tungsten, molybdenum, niobium, tungsten silicide, molybdenum silicide, and niobium silicide.

In the third manufacturing method, it is preferable that the step (A) is forming, on a base substrate, a Group III nitride semiconductor layer that is expressed by a composition formula of $Al_uGa_vIn_{1-u-v}N$ (where $0 \leq u \leq 1$, $0 \leq v \leq 1$, and $u+v \leq 1$)

In the third manufacturing method, it is preferable that the step (B) includes: (B-1) forming a patterned mask film on the surface of the semiconductor layer; and (B-2) oxidizing portions of the surface of the semiconductor layer that are not covered with the mask film to form the oxidized regions. In this connection, the oxidized regions can be formed by the same method as the oxidation method described above and have a thickness of, for example, 0.01 μm to 1.0 μm, preferably 0.05 μm to 0.5 μm.

In the step (B-2) of the third manufacturing method, the method of forming the oxidized regions is not particularly limited but may be, for example, a method in which oxygen ions are implanted, a thermal oxidation method in which a heat treatment is carried out in an atmosphere containing oxygen, or a method in which a treatment is carried out with oxygen plasma.

It is that preferable that the first to fourth manufacturing methods further include the step of removing the mask film In the first to fourth manufacturing methods described above, it is preferable that the base substrate is a sapphire substrate whose surface is a (0001) plane.

In the first to fourth manufacturing methods described above, it is preferable that the Group III element is gallium and the Group III nitride crystals are crystals of gallium nitride.

In the first to fourth manufacturing methods described above, it is preferable that the atmosphere is a pressurized atmosphere.

In the first to fourth manufacturing methods described above, it is preferable that the melt further includes alkaline-earth metal. Examples of the alkaline-earth metal include Ca, Mg, Sr, and Ba.

In the first to fourth manufacturing methods described above, it is preferable that a cycle of portions of a Group III nitride semiconductor layer are selected as seed crystals is at least 30 μm, more preferably at least 50 μm, further preferably at least 100 μm, and particularly preferably at least 1000 μm. The "cycle of portions of a Group III nitride semiconductor layer are selected as seed crystals" denotes the mean value of distances between centers (center lines) of adjacent portions of a Group III nitride semiconductor layer surface are selected as seed crystals. The cycle can be measured with, for instance, the cross-sectional scanning electron microscope (SEM) or the cross-sectional transmission electron microscope (TEM).

A Group III nitride substrate of the present invention is one manufactured by the manufacturing method of the present invention.

In the substrate of the present invention, a cycle of dense dislocation areas is at least 30 μm, more preferably at least 50 μm, further preferably at least 100 μm, and particularly preferably at least 1000 μm. The "dense dislocation areas" denote areas where the number of edge dislocations or screw dislocations is at least $10^7$ to $10^8$ per $cm^2$. The "cycle of dense dislocation areas" denotes the mean value of distances between portions with the highest dislocation density. Examples of the method of determining it include a method in which cathodoluminescence (CL) generated by electron beam irradiation is observed and thereby the number of dislocations is determined from the number of dark spots, and a method in which etching is carried out with acid (200° C.) such as, for example, pyrophosphoric acid, and then concavities and convexities are observed by atomic force microscopy (AFM) or the like. In the above, the "portions with the highest dislocation density" denote, for example, portions where dark spots are concentrated most in a CL image.

Preferably, the Group III nitride substrate of the present invention includes a Group III nitride semiconductor layer having oxidized regions in its portions and Group III nitride crystals formed on the semiconductor layer through liquid phase growth, wherein the oxidized regions are those formed in the portions by the step (B) according to the third manufacturing method.

Furthermore, it is preferable that the Group III nitride substrate of the present invention includes a Group III nitride semiconductor layer having at least one of a region formed of AlGaN and a region formed of AlN, in its portions, and Group III nitride crystals formed on the semiconductor layer through liquid phase growth.

Furthermore, it is preferable that the Group III nitride substrate of the present invention includes a Group III nitride semiconductor layer having diamond-like carbon, and Group III nitride crystals formed on the semiconductor layer through liquid phase growth.

In the present invention, when a GaN substrate is to be manufactured, it is preferable that $Al_2O_3$ and at least one selected from GaN and AlGaN are used in combination as the mask film and the semiconductor layer to serve as seed crystals, respectively. This is because this combination allows GaN crystals to grow selectively from portions of the semiconductor layer surface that are not covered with the mask film ($Al_2O_3$).

A semiconductor device of the present invention includes a substrate and a semiconductor element formed on the substrate, wherein the substrate is a Group III nitride substrate manufactured by the manufacturing method of the present invention described above.

In the semiconductor device, the semiconductor element may be, for instance, a laser diode or a light emitting diode.

Hereinafter, embodiments of the present invention are described using examples. In the following descriptions, parts that are identical to each other may be indicated with the same numerals and the same descriptions thereof may not be repeated each time.

EMBODIMENT 1

An example of the first manufacturing method of the present invention for manufacturing a Group III nitride substrate is described below with reference to FIGS. 1A to 1C.

Figure 1B:
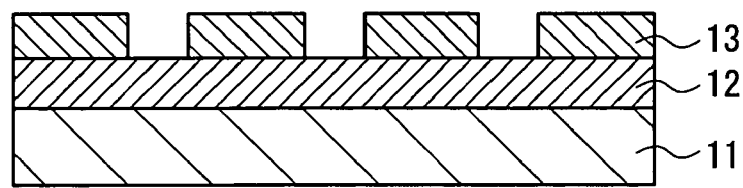
Figure 1C:
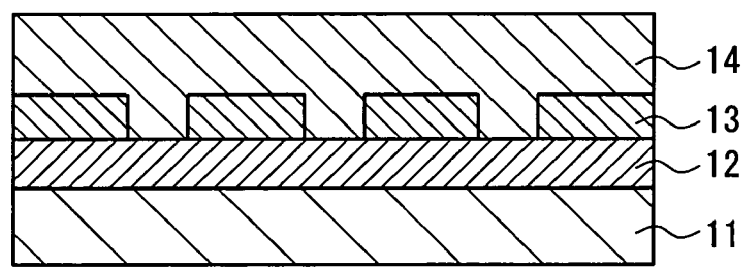

FIGS. 1A to 1C are cross-sectional views showing an example of steps of the first manufacturing method according to the present invention. First a semiconductor layer 12 that is expressed by a composition formula of $Al_uGa_vIn_{1-u-v}N$ (where $0 \leq u \leq 1$, $0 \leq v \leq 1$, and $u+v \leq 1$) is prepared (step (i)). On this step, for example, the semiconductor layer 12 is formed on a base substrate 11, as shown in FIG. 1A. The semiconductor layer 12 can be formed by, for instance, a metalorganic chemical vapor deposition (MOCVD) method, a molecular beam epitaxy (MBE) method, or a hydride vapor phase epitaxy (HVPE) method. The base substrate 11 can be, for example, a sapphire substrate, a GaAs substrate, a Si substrate, a SiC substrate, or a AlN substrate. The sapphire substrate can be, for instance, a sapphire substrate whose surface is a (0001) plane.

Seed crystals made of GaN crystals alone can be obtained by, for example, growing GaN crystals with a thickness of at least a few hundreds of micrometers on a substrate such as a sapphire substrate using, for instance, the HVPE method and then separating the substrate therefrom. An example of the method of growing GaN crystals using the HVPE method is described below. First, a GaN layer is formed on a sapphire substrate by the MOCVD method. Next, a Ti film is formed on the GaN layer and then is heat-treated with $NH_3$ and thereby a TiN film with voids is formed. Thereafter, GaN crystals with a thickness of, for example, 600 μm are grown on the TiN film using the HVPE method. In the HVPE method, a Ga melt is put in s Ga boat, hydrogen gas and hydrogen chloride gas are sprayed on the Ga boat, and thereby GaCl is generated. Subsequently, hydrogen gas and $NH_3$ gas are sprayed around the susceptor with the sapphire substrate placed thereon to grow the GaN crystals on the sapphire substrate. Thereafter, the GaN crystals are separated from the sapphire substrate. Thus, a GaN substrate (crystals) can be obtained. This GaN substrate can be used as, for instance, the semiconductor layer (seed crystals). Furthermore, for example, GaN crystals grown from the liquid phase also can be used as the semiconductor layer (seed crystals).

Next, as shown in FIG. 1B, a patterned mask film 13 is formed on the semiconductor layer 12 (step (ii)). The mask film 13 is formed of a material that tends not to melt in a GaN melt. For instance, diamond-like carbon or materials that are expressed by a composition formula of $Al_uGa_{1-u}N$ (where $0 \leq u \leq 1$) such as, for example, AlN, AlGaN, and $Al_2O_3$ can be used for the mask film 13. When the semiconductor layer 12 is formed using GaN, it is preferable that the mask film 13 is formed of a material that is expressed by a composition formula of $Al_uGa_{1-u}N$ (where $0.05 \leq u \leq 1$). When using a mask film formed of a material that is expressed by the composition formula of $Al_uGa_{1-u}N$ (where $0 \leq u \leq 1$), it is preferable that the percentage content (a composition ratio) of Al contained therein is higher than that of Al contained in the semiconductor layer 12. Examples of the method of forming the mask film include a sputtering method, a CVD method, and a vapor deposition method.

The thickness of the mask film is, for instance, 0.05 μm to 10 μm, preferably 0.1 μm to 3 μm. In addition, it is preferable that the surface of the mask film has been oxidized.

Figure 2A:
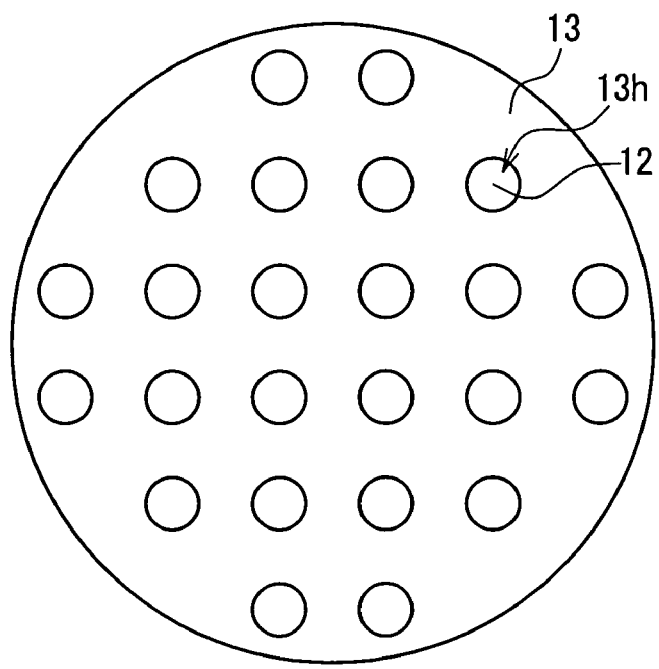
Figure 2B:
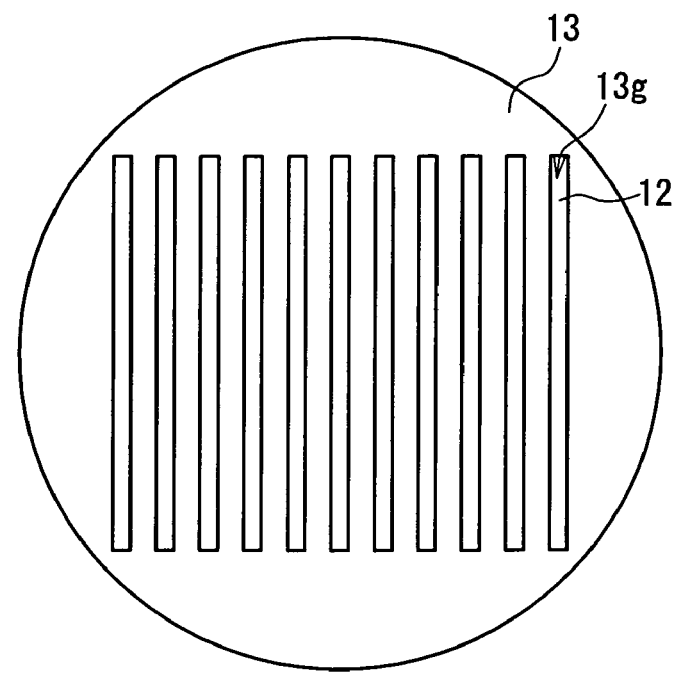

The mask film 13 may have a plurality of through holes formed therein. When the through holes are formed, portions of the semiconductor layer located under the through holes are not covered with the mask film and thereby Group III nitride crystals can grow selectively, with the uncovered portions serving as seed crystals. When the mask film is viewed from its upper side, the through holes may have, for instance, a dot shape or a stripe shape. FIGS. 2A and 2B each show a plan view of the mask film 13 formed in each case. When the through holes are patterned into dots as shown in FIG. 2A, dot-like portions of the semiconductor layer 12 are exposed through the through holes 13h of the mask film 13. When the through-holes are patterned into stripes as shown in FIG. 2B, stripe-like portions of the semiconductor layer 12, are exposed through the through holes 13g of the mask film 13. When the mask film 13 contains diamond-like carbon, the through holes can be formed by, for example, forming a resist pattern by photolithography and then carrying out dry etching using oxygen gas. When the mask film 13 contains AlN or AlGaN, the through holes can be formed by, for example, forming a resist pattern by photolithography and then carrying out etching. Furthermore, an Al layer is formed on the semiconductor layer, and a second mask film further is formed thereon. Subsequently, the second mask film is patterned to form through holes, and portions of the Al layer that are not covered with the second mask film are subjected to an oxidation treatment (for instance, a heat treatment carried out in an oxygen atmosphere) through the through holes. Accordingly, the uncovered portions are oxidized to form $Al_2O_3$, and then the portions of $Al_2O_3$ can be used as the mask film. The mask film located on the Al layer can be removed together with the Al layer by a well-known method.

Next, as shown in FIG. 1C, Group III nitride crystals 14 are grown on the semiconductor layer 12, with the portions of the semiconductor layer 12 that are not covered with the mask film 13 serving as seed crystals (step (iii)). The crystals can be grown by, in an atmosphere containing nitrogen, bringing portions of the surface of the semiconductor layer 12 into contact with a melt containing the nitrogen, alkali metal, and at least one Group III element selected from gallium, aluminum, and indium, and making the at least one Group III element react with the nitrogen that has dissolved in the melt. The melt is prepared by, for example, placing materials in a crucible and then heating them. The temperature of the melt and the pressure of the atmosphere are adjusted so that after the seed crystals are brought into contact with the melt, the Group III nitride contained in the melt is supersaturated and thereby crystals of a Group III nitride semiconductor grow on the semiconductor layer.

The Group III element that is melted in the melt is selected according to the semiconductor whose crystals are to be grown. The Group III element can be gallium, aluminum, indium, or any combination thereof. When crystals of gallium nitride are to be formed, gallium alone is used. The alkali metal can be at least one selected from sodium (Na), lithium (Li), and potassium (K), i.e. one of them or a mixture thereof, which usually serves as a flux (the same applies to the embodiments described below). Among them, a mixture of Na and Li is further preferable. In the liquid phase growth in which a mixed flux containing Na and Li is used, the growth rate at which crystals grow in the direction perpendicular to the (0001) direction, i.e. in the lateral direction with respect to the base substrate (seed crystals) is higher than that at which crystals grow in the (0001) direction. The crystal portions that have grown in such a manner have fewer dislocations. Hence, such liquid phase growth is desirable for the selective growth of the present invention.

With the step (iii), the Group III nitride crystals 14 grow on the semiconductor layer 12 and the mask film 13. Through this crystal growth, Group III nitride crystals (for instance, GaN single crystals) whose composition is expressed by a composition formula of $Al_xGa_yIn_{1-x-y}N$ (where $0 \leq x \leq 1$ and $0 \leq y \leq 1$) can be formed.

In the step (iii), the atmosphere containing nitrogen can be, for example, a nitrogen gas ($N_2$) atmosphere or a nitrogen gas atmosphere containing ammonia. Preferably, this atmosphere is a pressurized atmosphere, specifically, a pressurized atmosphere of higher than 1 atm ($1 \times 1.013 \times 10^5$ Pa) but lower than 100 atm ($100 \times 1.013 \times 10^5$ Pa). The conditions for the melting of materials and the crystal growth vary depending on the components of the flux, the components of the ambient gas, and the pressure thereof. However, for example, the temperature of the melt is about 700° C. to 1100° C. and the pressure is about 1 atm ($1 \times 1.013 \times 10^5$ Pa) to 100 atm ($100 \times 1.013 \times 10^5$ Pa).

The melt further may include alkaline-earth metal. The alkaline-earth metal can be, for instance, Ca, Mg, Sr, and Ba.

According to the method of Embodiment 1, since crystals are grown selectively from the seed crystals, Group III nitride crystals with a lower dislocation density can be obtained, as compared to the conventional vapor growth method. Furthermore, the method of Embodiment 1 allows Group III nitride crystals with higher surface flatness to be obtained. In this case, when the part (the sapphire substrate) other than the Group III nitride crystals is ground to be removed after the growth of the Group III nitride crystals, a substrate can be obtained that is formed of Group III nitride crystals alone.

EMBODIMENT 2

Next, an example of the second manufacturing method of the present invention for manufacturing a Group III nitride substrate is described with reference to FIGS. 3A to 3C.

Figure 3A:
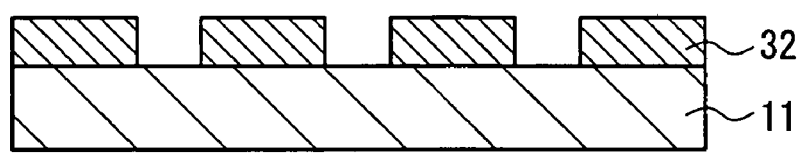
FIGS. 3A to 3C are cross-sectional views showing steps of another example of the manufacturing method according to the present invention.
Figure 3B:
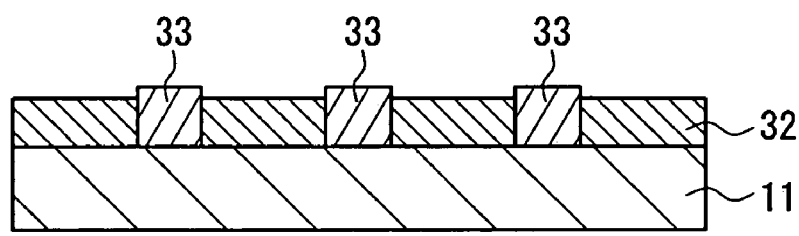
Figure 3C:
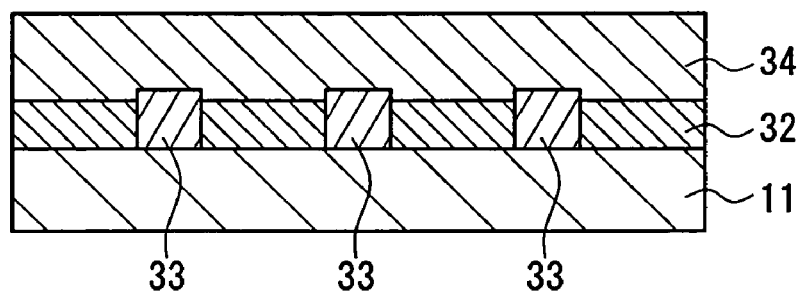

FIGS. 3A to 3C are cross-sectional views showing an example of steps of the second manufacturing method according to the present invention. As shown in FIG. 3A, a patterned mask film 32 is formed on a base substrate 11 (step (I)). The mask film 32 may be formed of, for instance, silicon nitride, silicon oxide, silicon nitride oxide, aluminum oxide, or aluminum nitride oxide. Furthermore, the mask film may be formed of high melting metal or a high melting metallized material that has a high melting point (a melting point of at least 1000° C.). For instance, titanium, tungsten, molybdenum, niobium, tungsten silicide, molybdenum silicide, or niobium silicide can be used for the mask. The thickness of the mask film 32 is, for example, 0.005 μm to 1 μm, preferably 0.05 μm to 0.5 μm. The method of forming the mask film, the method of patterning the mask film, and the shape of the mask film are the same as those described in Embodiment 1.

Figure 4A:
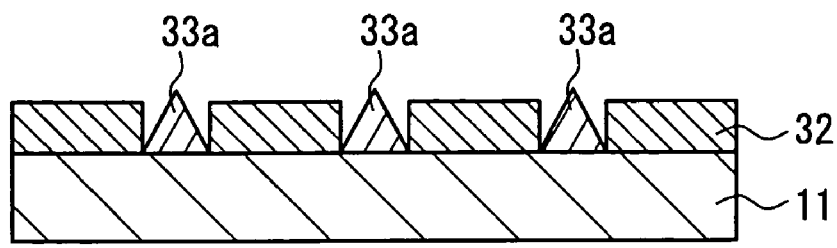
FIGS. 4A to 4C are cross-sectional views showing examples of an step of the manufacturing method according to the present invention.
Figure 4B:
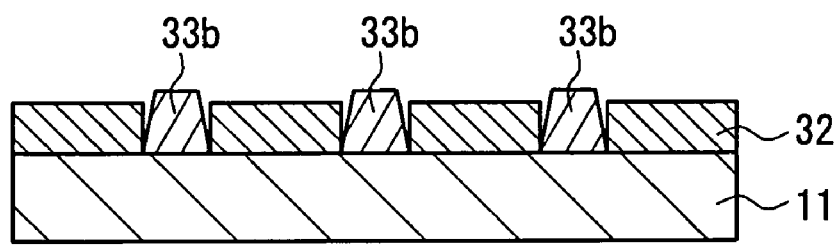
Figure 4C:
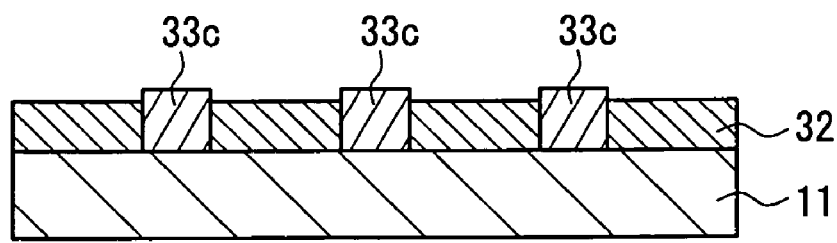

Next, as shown in FIG. 3B, semiconductor layers 33 formed of crystals that are expressed by a composition formula of $Al_uGa_vIn_{1-u-v}N$ (where $0 \leq u \leq 1$, $0 \leq v \leq 1$, and $u+v \leq 1$) are formed on portions of the base substrate 11 that are not covered with the mask film 32 (step (II)). The semiconductor layers 33 can be formed by, for instance, a metalorganic chemical vapor deposition (MOCVD) method or a hydride vapor phase epitaxy (HVPE) method. The shape of the semiconductor layers 33 can be varied by changing the growth temperature. FIGS. 4A to 4C show cross-sectional views of semiconductor layers 33 that have grown into various shapes. For example, when crystal growth is carried out at a temperature of 1010° C. by the MOCVD method, the semiconductor layers 33z grow into a conical shape (FIG. 4A). When the crystal growth is carried out at a temperature of 1040° C., the semiconductor layers 33b grow into a trapezoidal shape (FIG. 4B). Furthermore, when the crystal growth is carried out at a temperature of 1070° C., the semiconductor layers 33c grow into a columnar or rectangular-parallelepiped shape (FIG. 4C).

Subsequently, in an atmosphere containing nitrogen (preferably, a pressurized atmosphere of 100 atm ($100 \times 1.013 \times 10^5$ Pa) or lower), the surfaces of the semiconductor layers 33 are brought into contact with a melt containing the nitrogen, alkali metal, and at least one Group III element selected from gallium, aluminum, and indium and thereby Group III nitride crystals are grown on the semiconductor layers 33, with the semiconductor layers 33 serving as seed crystals (step (III)). The step (III) can be carried out by the same method as that employed in the step (iii) described in Embodiment 1 and therefore the description thereof is not repeated herein. Through this step, as shown in FIG. 3C, Group III nitride crystals 34 grow on the semiconductor layers 33. The mask film 32 may be removed before the formation of the Group III nitride crystals 34.

The melt further may include alkaline-earth metal. The alkaline-earth metal can be, for instance, Ca, Mg, Sr, or Ba. According to this method, the Group III element reacts with the nitrogen dissolved in the melt and thereby Group III nitride crystals can be obtained that are expressed by a composition formula of $Al_xGa_yIn_{1-x-y}N$ (where $0 \leq x \leq 1$, $0 \leq y \leq 1$, and $x+y \leq 1$). Examples thereof include GaN crystals and crystals that are expressed by a composition formula of $Al_xGa_{1-x}N$ (where $0 \leq x \leq 1$).

Thus, a substrate with Group III nitride crystals can be obtained. In the conventional liquid phase growth method, a GaN seed crystal substrate is melted in a melt in the initial stage of the growth of GaN crystals. Accordingly, irregularities are caused at the surfaces of seed crystals and crystals grow from such surfaces. Hence, a GaN crystal substrate thus obtained may have deteriorated surface flatness or dislocation may occur in part of the crystals at random in some cases. On the other hand, in the method of Embodiment 2 (the second manufacturing method of the present invention), crystals are grown selectively from seed crystals. Accordingly, the substrate thus obtained has improved flatness and a reduced dislocation density. Consequently, the method of Embodiment 2 allows Group III nitride crystals with high flatness and fewer dislocations to be manufactured at low cost.

In the manufacturing method of the present embodiment, the cycle of the portions of the base substrate that are not covered with the mask film is, for example, at least 30 μm, preferably at least 50 μm, more preferably at least 100 μm, and further preferably at least 1000 μm.

EMBODIMENT 3

The following description is directed to the third manufacturing method of the present invention for manufacturing a Group III nitride substrate.

In the manufacturing method of Embodiment 3, first, a semiconductor layer that is expressed by a composition formula of $Al_uGa_vIn_{1-u-v}N$ (where $0 \leq u \leq 1$, $0 \leq v \leq 1$, and $u+v \leq 1$) is prepared (step (A)). This step is the same as the step (i) described in Embodiment 1. On this step, the semiconductor layer is, for instance, formed on a base substrate.

Next, oxidized regions are formed through oxidation of portions of the surface of the semiconductor layer formed in the step (A) (step (B)). The formation of the oxidized regions can prevent crystals from growing from the oxidized portions. The step (B) can be carried out by, for instance, steps (B-1) to (B-3) described below.

First, a patterned mask film is formed on the surface of the semiconductor layer (step (B-1)). The mask film can be patterned and formed using known materials and methods that are commonly used in the semiconductor process.

Next, the portions of the surface of the semiconductor layer that are not covered with the mask film are oxidized and thereby the oxidized regions are formed in the portions of the surface of the semiconductor layer (step (B-2)). The method of oxidizing the semiconductor layer is not particularly limited. However, for instance, a thermal oxidation method in which the semiconductor layer is heat-treated in an atmosphere containing oxygen, a method in which oxygen ions are implanted, or a method in which the semiconductor layer is treated with oxygen plasma can be used for the oxidation. Preferably, the oxidized region has a thickness of at least 0.01 μm.

Subsequently, the mask film is removed (step (B-3)). The method of removing the mask film can be selected according to the type of the mask film, and a common method can be employed.

Subsequently to the step (B), in an atmosphere containing nitrogen, the surface of the semiconductor layer is brought into contact with a melt containing the nitrogen, alkali metal, and at least one Group III element selected from gallium, aluminum, and indium, and thereby Group III nitride crystals are grown on the semiconductor layer, with regions of the semiconductor layer other than the oxidized regions serving as seed crystals (step (C)). The crystal growth step of the step (C) is identical to the step (iii) described in Embodiment 1. Hence, the description thereof is not repeated herein.

Thus, Group III nitride crystals (for instance, GaN single crystals) can be formed that are expressed by a composition formula of $Al_xGa_yIn_{1-x-y}N$ (where $0 \leq x \leq 1$ and $0 \leq y \leq 1$). According to the manufacturing method of Embodiment 3 (the third manufacturing method of the present invention), the same effects as those obtained in Embodiments 1 and 2 can be obtained.

EMBODIMENT 4

The following method also allows Group III nitride crystals to be grown selectively.

First, a semiconductor layer that is expressed by a composition formula of $Al_uGa_vIn_{1-u-v}N$ (where $0 \leq u \leq 1$ and $0 \leq v \leq 1$) is formed on a base substrate (step (a)). The semiconductor layer can be formed by, for instance, the MOCVD method or the MBE method.

Next, a patterned mask film is formed on the semiconductor layer, then portions of the semiconductor layer that are not covered with the mask film are removed to expose corresponding portions of the base substrate and to form convex seed semiconductor layers that are covered with the mask film, and then the mask film is removed (step (b)). The convex portions can be formed by a well-know method using photolithography and etching in combination. Usually, the upper surfaces of the convex portions are C-planes. The shape of the convex portions can be a shape that facilitates the separation of the base substrate in the step to be carried out later. The convex portions may be formed, for instance, in stripes or dots.

Furthermore, in an atmosphere containing nitrogen (preferably, a pressurized atmosphere of a pressure of 100 atm ($100 \times 1.013 \times 10^5$ Pa) or lower), the surfaces of the convex portions of the semiconductor layer are brought into contact with a melt containing the nitrogen, alkali metal, and at least one Group III element selected from gallium, aluminum, and indium and the at least one Group III element is made to react with the nitrogen dissolved in the melt. As a result, Group III nitride crystals are grown on the upper surfaces of the convex portions of the semiconductor layer (step (c)).

In this manner, gaps are formed between the substrate and the Group III nitride crystals. In the present embodiment, since the Group III nitride crystals are grown from a liquid phase in the melt containing the nitrogen dissolved therein, alkali metal, and a Group III element, the lateral growth rate can be increased as compared to that achieved in the conventional vapor growth methods such as the MOCVD method and the HVPE method. Accordingly, even when the area of the convex portions accounts for, for example, 10% of the whole area or smaller, crystals grown from the convex portions can dock with each other. For instance, when being formed in stripes, the convex portions each have a width of, for example, 1 μm to 5 μm, and an interval between two adjacent convex portions is, for instance, 20 μm to 500 μm. A cycle of the convex portions is, for instance, preferably at least 30 μm, more preferably at least 50 μm, further preferably at least 100 μm, and particularly preferably at least 1000 μm.

Particularly, high power semiconductor lasers, whose active layer has wide stripes, require a large area with fewer dislocations. Furthermore, when a semiconductor element is produced on a substrate, mask alignment is necessary to be carried out with respect to the area with fewer dislocations. From the viewpoint of processing, it therefore is preferable that a large area with fewer dislocations is provided. Accordingly, a substrate having a large area with fewer dislocations provides a great practical effect.

Hereinafter, the present invention is described further in detail using examples. In the following examples, the description is directed to the case of growing GaN crystals. However, Group III nitride crystals that are expressed by a composition formula of $Al_xGa_yIn_{1-x-y}N$ (where $0 \leq x \leq 1$, $0 \leq y \leq 1$, and $x+y \leq 1$) such as, for example, $Al_xGa_{1-x}N$ or AlN also can be formed in the same manner.

EXAMPLE 1

In the present example, an example of the method in which a GaN crystal layer is formed on a sapphire substrate by the MOCVD method and a GaN single crystal layer is formed by a liquid phase epitaxial growth method is described with reference to the drawings.

Figure 6A:
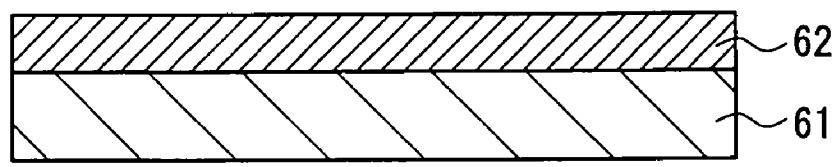
FIGS. 6A to 6D are cross-sectional views showing steps of another example of the manufacturing method according to the present invention.

FIGS. 6A to 6D are cross-sectional views showing steps of an example of a method of producing a seed crystal substrate. First, a seed crystal substrate is formed. Specifically, as shown in FIG. 6A, a seed layer 62 of GaN was grown on the sapphire substrate 61 by the MOCVD method. More specifically, the sapphire substrate 61 was heated to have a temperature of about 1020° C. to 1100° C. and then trimethylgallium (TMG) and $NH_3$ are supplied onto the substrate. Thus, a GaN layer was grown. In this case, preferably, the surface of the seed layer 62 is a Group III surface. Another method that allows a Group III nitride semiconductor to be formed also can be used. For instance, the HVPE method or MBE method may be used. For instance, the semiconductor is using thick GaN crystals on a substrate such as a sapphire substrate using the HVPE method and then separating the substrate therefrom. Similarly, in this case, it is preferable that the surface of the seed layer is a Group III surface.

The seed layer may include aluminum or indium other than gallium as a Group III element. The seed layer can be formed of a Group III nitride that is expressed by a composition formula of $Al_uGa_vIn_{1-u-v}N$ (where $0 \leq u \leq 1$, $0 \leq v \leq 1$, and $u+v \leq 1$).

Figure 6B:
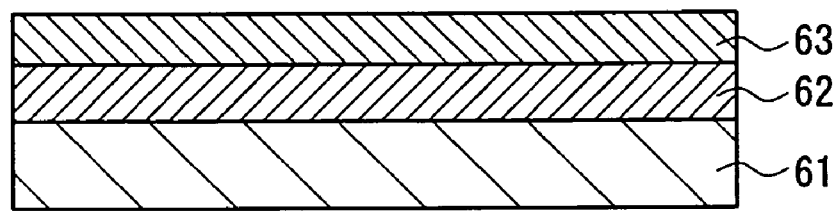

Next, a mask film was formed on the seed layer. Specifically, as shown in FIG. 6B, a mask film 63 was formed on the seed layer 62. For the mask film, materials that tend not to melt in a GaN melt are preferable and, for instance, diamond-like carbon (DLC), AlGaN, or AlN can be used. In the case of using AlGaN for the mask film, it is important for the mask film to have a higher percentage content of Al than that of the seed layer. This is because when the mask film includes a high percentage content of Al, its wettability is low in the crystal growth and the mask film tends not to melt in the GaN melt. Specifically, the composition ratio of Al contained in the mask film is preferably at least 3 atom % ($Al_{0.03}Ga_{0.97}N$), further preferably at least 5 atom % ($Al_{0.05}Ga_{0.95}N$). On the other hand, in the case of using AlGaN for the seed layer, it is preferable that its surface has been oxidized (the same applies to the following examples). In the present example, the mask film 63 was formed of $AM_{0.07}Ga_{0.93}N$ by the MOCVD method. Specifically, organic metal (such as, for instance, trimethylgallium or trimethylaluminum) and $NH_3$ were supplied onto the substrate (with a temperature of 1050° C.) at 26600 Pa (200 Torr), and thereby a mask film 63 of AlGaN was grown.

Figure 5:
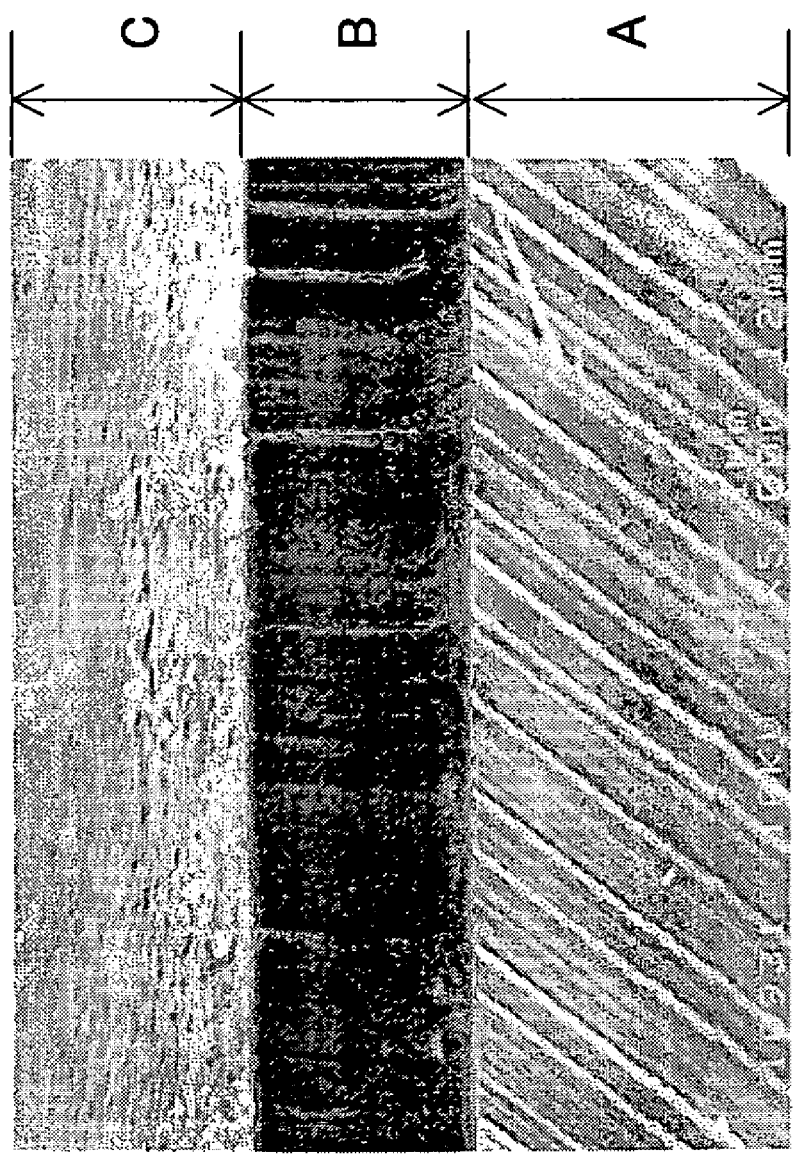
FIG. 5 is a cross-sectional view showing the meltability of Group III nitride in a GaN melt.

In order to examine variations in meltability of the mask film with respect to a Ga melt caused depending on its composition, a seed crystal substrate was immersed in a GaN melt (800° C., 10 atm) containing Na and Ca that served as a flux. A substrate with a GaN layer (with a thickness of 4 μm) and an $Al_{0.07}Ga_{0.93}N$ layer (with a thickness of 1.4 μm) being stacked on a sapphire substrate was used as the seed crystal substrate. FIG. 5 shows the picture of its cross-section taken after the immersion. In the picture, the character A denotes the sapphire substrate, the character B the (GaN+AlGaN) layers, and the character C the mask film. The side face of the GaN layer has been melted. However, the AlGaN layer has hardly been melted, and the (GaN+AlGaN) layers (indicated with the character B in FIG. 5) had a thickness of 5 μm after the immersion. Furthermore, no crystal growth was observed on the $Al_{0.07}Ga_{0.93}N$ layer. The resistance to the GaN melt varies according to the flux composition.

In order to evaluate the usefulness of AlN serving as the mask film, the meltabilities of an AlN film and a GaN film with respect to the melt containing Ga were compared with each other to be examined. First, a sapphire substrate with an AlN layer (with a thickness of 3 μm) stacked thereon and a sapphire substrate with an GaN layer (with a thickness of 3 μm) stacked thereon were prepared. Next, after 5 g of Ga, 4.4 g of Na, and the respective substrates thus prepared were placed in an alumina crucible, the crucible was set in a stainless steel container. The atmosphere inside the stainless steel container was a nitrogen atmosphere (at a pressure of 10 atm ($10 \times 1.013 \times 10^5$ Pa)), and the stainless steel container is heated in an electric furnace at 800° C. for 10 hours. Thereafter, the substrates are taken out and then are evaluated. As a result, in the substrate with the GaN layer stacked thereon, GaN stacked on the substrate was almost completely melted, while in the substrate with the AlN layer stacked thereon, hardly any change in its thickness was observed.

The DLC has an amorphous structure that includes a $sp_3$ bond of carbons that is identical to that of natural diamond, a $sp_2$ bond of carbons that is identical to that of graphite, and a bond with hydrogen. The DLC has high hardness and high resistance to various melts. A DLC film can be formed by, for instance, a sputter method or a plasma CVD method that utilizes energy of plasma generated using high-frequency power or the like in a vacuum vessel.

In order to prove that the DLC film can be used as the mask film, the resistance of diamond to the GaN melt containing a flux was examined. A melting test was carried out in which 1 g of Ga, 0.88 g of Na, and 0.038 g of diamond single crystals were placed in a crucible made of BN, which then was allowed to stand in an atmosphere of 2.5 atm ($2.5 \times 1.013 \times 10^5$ Pa) at 800° C. for 24 hours. No change in the surface of the diamond was observed after the test. The mass of the diamond crystals taken out from the crucible was measured and was 0.038 g, which was the same as the mass measured before the test. Accordingly, it was proved that diamond had resistance to the GaN melt containing a flux.

Figure 6C:
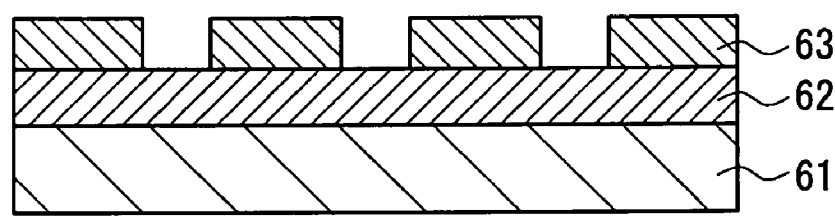

Subsequently, a resist pattern is formed by photolithography. The mask film 63 then is removed partially by dry etching and thereby the seed layer 62 is exposed partially as shown in FIG. 6C. For instance, the photolithography and dry etching are carried out so that portions with a dot shape of the seed layer 62 are not covered with the mask film 63 as shown in FIG. 6C.

An example of forming a mask film containing DLC is described below. First, a DLC film was formed on a seed layer by the plasma CVD method. For instance, the DLC film was formed through plasma discharge carried out under an ordinary pressure using hydrocarbon($C_xH_y$)-based gas as a raw material gas, with the sapphire substrate having a temperature of 100° C. Subsequently, a resist pattern was formed by photolithography, and the DLC film was removed partially by dry etching that is carried out using $O_2$ to expose the GaN seed layer partially. Thus, a mask film containing DLC can be formed.

Figure 6D:
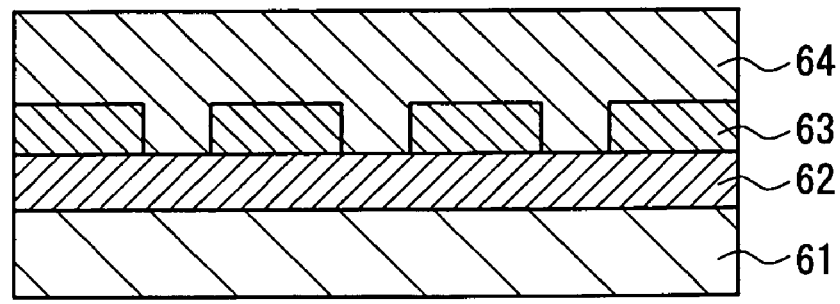

Using the seed crystal substrate thus obtained, the GaN crystals 64 were grown from the seed layer 62, by the LPE method as shown in FIG. 6D. The following description is directed to a method of growing the GaN crystals.

FIGS. 7A and 7B are schematic views showing an example of the configuration of a LPE apparatus that can be used in the manufacturing method of the present invention. The LPE apparatus shown in FIG. 7A includes: a raw material gas tank 71 for supplying nitrogen gas, or a mixed gas containing ammonia gas ($NH_3$ gas) and nitrogen gas, as a raw material gas; a pressure regulator 72 for regulating the pressure of a growth atmosphere; a leakage valve 73; a stainless steel container 74 to be used for carrying out crystal growth; and an electric furnace 75. FIG. 7B shows an enlarged view of the stainless steel container 74 inside of which a crucible 76 is set. The crucible 76 is made of boron nitride (BN), alumina ($Al_2O_3$), or the like. The crucible 76 can control its temperature within the range of 600° C. to 1000° C. The pressure (100 atm ($100 \times 1.013 \times 10^5$ Pa) to 150 atm ($150 \times 1.013 \times 10^5$ Pa)) of the atmosphere supplied from the raw material gas tank 71 can be controlled within the range of not higher than 100 atm ($100 \times 1.013 \times 10^5$ Pa) by the pressure regulator 72.

A method of growing the GaN crystals is described below. First, normal amounts of Ga and Na to serve as a flux were weighed and they were placed inside the crucible 76 together with the seed crystal substrate. In the present example, the mole ratio of Ga and Na was set at 2.7:7.3.

Subsequently, the crucible 76 was kept at 800° C. and nitrogen gas containing ammonia (40%) mixed therein was supplied at a pressure of 5 atm ($5 \times 1.013 \times 10^5$ Pa).

Mixing of ammonia in the nitrogen gas can reduce the pressure of the atmosphere in which the crystal growth takes place but is not always required. Even in a nitrogen gas atmosphere free from ammonia, crystals can be grown under a pressure of 50 atm ($50 \times 1.013 \times 10^5$ Pa). In this state, while the temperature and pressure were kept constant, the LPE growth was carried out for 96 hours. Thus, a substrate with the GaN crystals was obtained.

Figure 8:
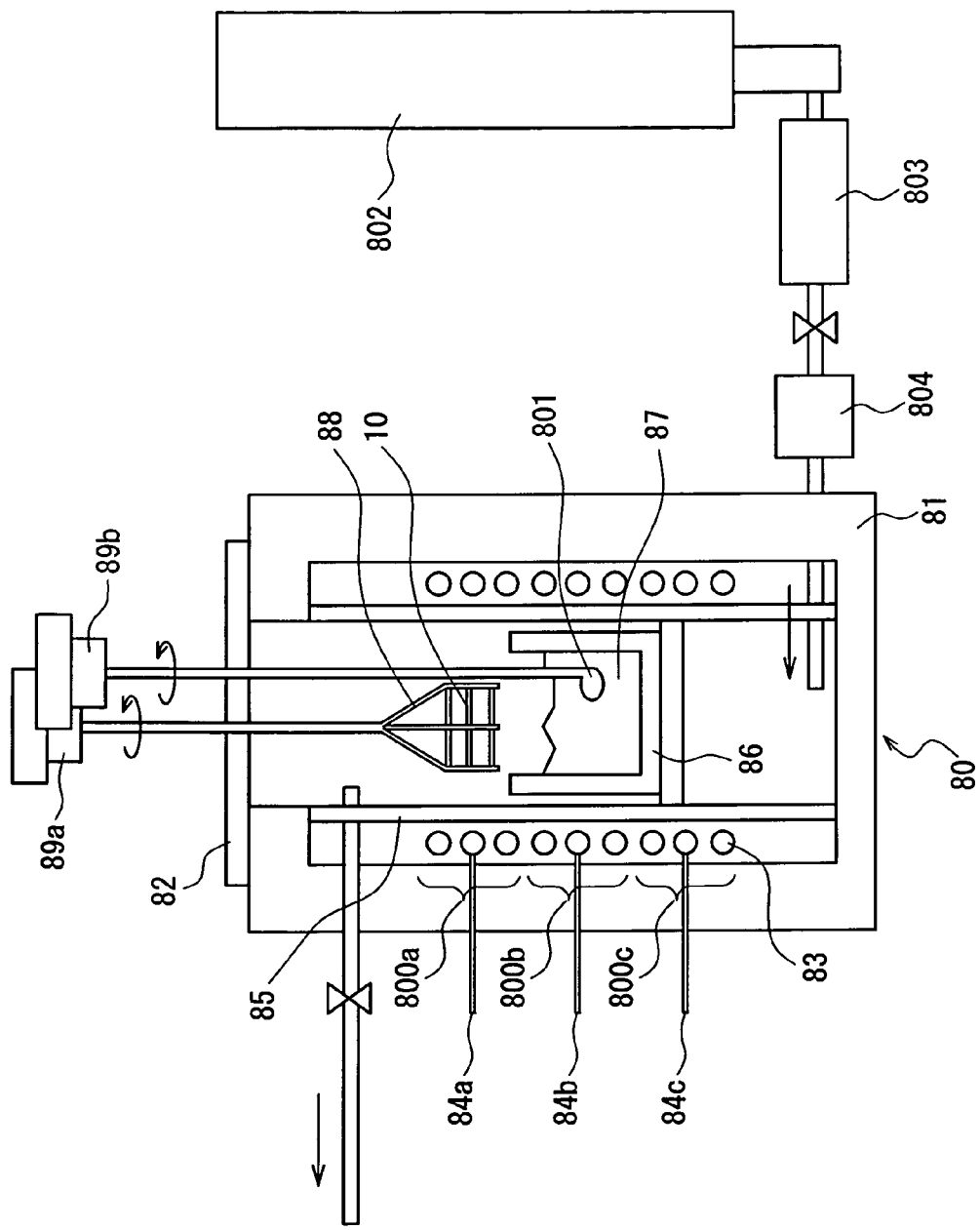
FIG. 8 is a schematic view showing a configuration of another example of the manufacturing apparatus to be used in the manufacturing method of the present invention.

FIG. 8 shows an example of a large LPE apparatus (an electric furnace) that can be used in the method of the present invention. The LPE apparatus shown in FIG. 8 includes an electric furnace 80 having a chamber 81 made of stainless steel and a furnace cover 82. The LPE apparatus is constructed to bear a pressure of 10 atm ($10 \times 1.013 \times 10^5$ Pa). Heaters 83 are provided inside the chamber 81. The chamber 81 is composed of three zones that are zones 800a, 800b, and 800c provided with thermocouples 84a, 84b, and 84c, respectively. The three zones are controlled so as to keep their temperature within a range of ±0.1° C., and thereby the temperature inside the furnace is controlled to be uniform. A core tube 85 is provided to improve the uniformity of the temperature inside the furnace and to prevent impurities from being introduced from the heaters 83.

A crucible 86 made of boron nitride (BN) is provided inside the core tube 85. A material is placed inside the crucible 86 and the temperature of the crucible 86 is raised to prepare a melt 87. A substrate 10 to serve as a seed crystal is attached to a substrate holding member 88. In the apparatus shown in FIG. 8, a plurality of substrates 10 can be attached to the substrate holding member 88. The substrate 10 is rotated by a rotary motor 89a. A stirring propeller 801 can be immersed in the melt 87. The propeller 801 is rotated by a rotary motor 89b. In the present example, a common rotary motor can be used since the ambient pressure is 10 atm ($10 \times 1.013 \times 10^5$ Pa) or lower. However, an electromagnetic induction rotary mechanism may be used under an ambient pressure exceeding 10 atm ($10 \times 1.013 \times 10^5$ Pa). Ambient gas (a raw material gas) is supplied from a gas source 802. The pressure of the ambient gas is regulated by a pressure regulator 803. The ambient gas is fed into the furnace after impurities are removed therefrom by a gas purification unit 804.

The following description is directed to a method of growing crystals.

(1) First, predetermined amounts of Ga and Na to serve as a flux are weighed and then were placed inside the crucible 86. As Ga there was used a material with a purity of 99.9999% (six nine). As Na there was used purified Na. Na can be purified as follows: Na was heated to melt in a glove box, the inside of which had been subjected to He substitution, and then for example, oxides emerging on the surface layer were removed. Alternatively, Na may be purified by zone refining. In the zone refining, Na is melted and solidified repeatedly in a tube and thereby impurities deposit and then are removed. Thus, the purity of Na can be increased.

(2) In order to melt the raw material placed inside the crucible, the temperature inside the electric furnace was raised to 900° C. In this stage, the seed crystal substrate was not placed inside the crucible. In order to mix Ga and Na, the melt was stirred for several hours, with the propeller being immersed in the melt. Since there is a great difference in specific gravity between Ga and Na, Ga sinks to the bottom part of the melt unless the melt is kept stirred. This results in Ga being not contained uniformly in the melt, which in turn affects the growth rate considerably. In the present example, the melt was stirred, with the temperature inside the electric furnace (the crucible) being 900° C. In the case of the Na—Ga melt, however, when the temperature inside the electric furnace (the crucible) is at least 556° C., the Na—Ga alloy is brought into a liquid phase and therefore can be stirred more steadily. Examples of the stirring method include a method using a propeller and a method in which temperature distribution is provided to generate thermal convection in a controlled manner. Furthermore, in order to prevent GaN from being oxidized, it is preferable that nitrogen gas is used as the ambient gas.

(3) Next, the temperature of the crucible was set at 800° C. to bring the melt into a supersaturation state. Subsequently, the seed crystal substrate was lowered to the position just above the surface of the melt and its temperature was made to approach the temperature of the melt. After several minutes, the seed crystal substrate was put into the melt to allow crystals to start growing.

(4) During the crystal growth, the substrate was rotated at a rotational speed in the range of 10 rpm to 200 rpm. Desirably, the substrate is rotated at around 100 rpm. After the crystals were grown for 24 hours, the substrate was lifted to be taken out from the melt. After being lifted, the substrate was rotated at a speed of 300 rpm to 1500 rpm in order to remove the melt remaining on the substrate surface. Desirably, the substrate is rotated at around 1000 rpm. Thereafter, the substrate was taken out of the chamber. During the crystal growth, the temperature of the crucible (the temperature of the melt) may be kept constant. However, the temperature of the melt may be lowered at a constant rate to keep the supersaturation of the melt constant.

In the present example, a flux containing Na alone was used. However, similar effects can be obtained even when using a mixed flux containing alkaline-earth metal such as, for example, Ca and a Li, Na, or K flux. For instance, when using a mixed flux containing Na and Ca, the Ca mixed to account for about 10% of the whole allows crystals to grow under lower pressure.

As described above, according to the present invention, a GaN single crystal substrate that has high flatness, excellent crystallinity, and a low dislocation density can be manufactured with high mass-productivity. That is, substrates that allow highly reliable devices to be supplied can be provided at low cost. According to the present invention, since the substrate with high flatness can be obtained, the processing of devices such as semiconductor lasers can be simplified, and devices can be manufactured with high yields.

In the present example, the description was directed to the manufacture of the GaN single crystal substrate using gallium. Preferably, a substrate is manufactured that has a low absorptance with respect to the wavelengths used in an optical device to be produced on the base substrate. Accordingly, it is preferable that a substrate for a semiconductor laser or a light emitting diode that emits light in the ultraviolet region is formed of $Al_xGa_{1-x}N$ (where $0 \leq x \leq 1$) single crystals that contain a large amount of Al and have low absorptivity with respect to light with short wavelengths. According to the present invention, such Group III nitride semiconductor single crystals can be formed even when part of Ga is substituted by another Group III element.

EXAMPLE 2

In the present example, the description is directed to an example of the method in which a GaN seed layer and a stripe-like mask film are formed on a sapphire substrate by the MOCVD method and then a single crystal layer is formed by the liquid phase epitaxial growth method.

Using a sapphire (crystalline $Al_2O_3$) substrate as the base substrate, a seed layer containing GaN was formed on the sapphire substrate by the MOCVD method. Further, a mask film patterned into stripes was formed on the seed layer. Preferably, a material that tends not to melt in a GaN melt is used for the mask film as in Example 1. For instance, diamond-like carbon (DLC), AlGaN, or AlN can be used for the mask film. Among them, AlN is preferable. In the case of using AlGaN, it is important for the mask film to have a higher percentage content of Al than that of the seed layer. This is because when the mask film includes a high percentage content of Al, its wettability is low in the crystal growth and the mask film tends not to melt in the GaN melt. Hence, AlGaN is suitable for the mask film. The composition ratio of Al contained in the Group III element is preferably at least 3 atom % ($Al_{0.03}Ga_{0.97}N$), further preferably at least 5 atom % ($Al_{0.05}Ga_{0.95}N$). In the present example, $Al_{0.07}Ga_{0.93}N$ was used. Using the MOCVD method, organic metal (such as, for instance, trimethylgallium or trimethylaluminum) and $NH_3$ were supplied onto the base substrate, and thereby an AlGaN mask film was grown. Thereafter, the $Al_{0.07}Ga_{0.93}N$ mask film was patterned into stripes and thereby stripe-like portions of the GaN seed layer were exposed.

Figure 9:
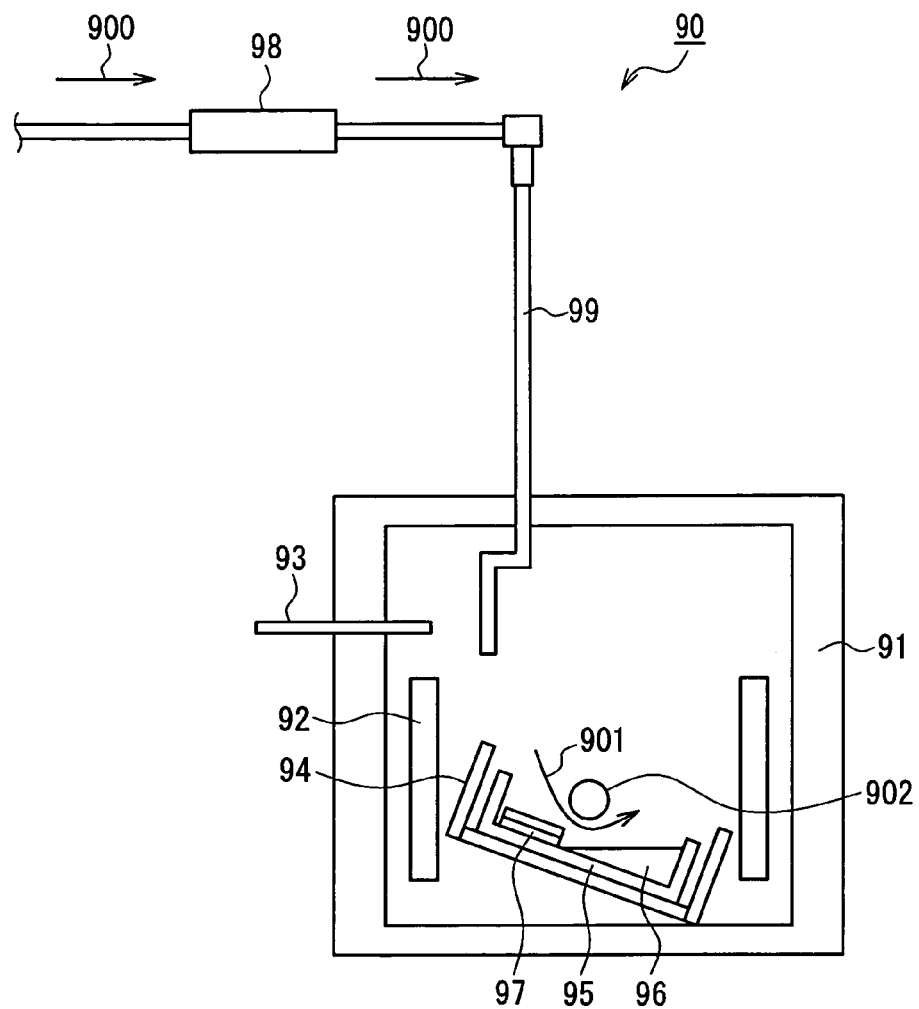
FIG. 9 is a schematic view showing a configuration of still another example of the manufacturing apparatus to be used in the manufacturing method of the present invention.

Next, FIG. 9 shows an example of a rocking-type LPE apparatus that can be used in the method of the present invention. This rocking-type LPE apparatus 90 includes a growth furnace 91 made of stainless steel and a flow regulator 98. The growth furnace 91 and the flow regulator 98 are connected to each other through a tube 99. The growth furnace 91 includes a heater 92 and a thermocouple 93 disposed therein and can resist a pressure of 50 atm ($50 \times 1.013 \times 10^5$ Pa). Furthermore, inside the growth furnace 91, a crucible holding member 94 is provided, and a mechanism is attached that rotates about an rotary shaft 95 in the direction shown with the arrow 901 in FIG. 9. A crucible 95 made of boron nitride (BN) is attached to the inner side of the crucible holding member 94, and a melt 96 and seed crystals 97 are placed inside the crucible 95. With the swing of the crucible holding member, the melt present inside the crucible 95 moves from side to side. Accordingly, the growth direction in which crystals grow on the seed crystals is controlled to a certain direction. In the present example, it is preferable that the GaN seed crystal substrate 97 is attached so that the direction in which the melt moves is parallel to the stripe-like mask film formed on the seed crystals 97. The ambient pressure is regulated by the flow regulator 98. An ambient gas is fed, in the direction shown with the arrows 900 in FIG. 9, from a raw material gas tank for feeding nitrogen gas or a mixed gas of ammonia gas ($NH_3$ gas) and nitrogen gas that is a raw material gas. The ambient gas is sent into the growth furnace 91 after impurities are removed therefrom in a gas purifying unit.

A crystal growth method is described bellow.

By the same method as that used in Example 1, a material containing Ga and Na was prepared. Next, in order to melt the raw material placed inside the crucible 95, the temperature inside the growth furnace 91 was raised up to 800° C. In order to prevent GaN from being oxidized, nitrogen gas was used as the ambient gas. During the crystal growth, the crucible holding member 94 rocked so as to complete one cycle per minute. After crystals were grown for 24 hours, the substrate was taken out of the melt.

In this method, while the crucible holding member 94 rocks so as to complete one cycle per minute, crystals were grown with the seed crystal substrate 97 coming out of the GaN melt each time the crucible holding member 94 rocks. The crystals, however, may be grown with the seed crystal substrate 97 remaining in the melt continuously while the crucible holding member 94 rocks.

In the present example, the direction in which the crystals grow can be controlled by the side-to-side movement of the melt. That is, when the crystal growth is controlled so that the crystals grow in the direction parallel to the stripe-like mask film, crystals start growing from stripe-like portions of the seed layer that are exposed, and thereby dislocations can be concentrated in those portions alone. As a result, GaN single crystals with particularly fewer dislocations can be grown in portions other than the stripe-like portions of the seed layer that are not covered with the mask film.

In the conventional method, the control of dislocations is difficult and the dislocations caused in a Group III nitride substrate obtained by the conventional method vary within the range of $10^4$ to $10^6$ $cm^{-2}$ depending on regions of the substrate. However, when the Group III nitride crystals are grown selectively as in the manufacturing method of the present invention, dislocations can be controlled steadily to $10^4$ $cm^{-2}$ or less in the portions formed through lateral growth of the Group III nitride crystals (i.e. the portions that are not in contact with the portions of the semiconductor layer (seed crystals) that are not covered with the mask film).

In the present example, a flux containing Na alone was used. However, similar effects can be obtained even when using a mixed flux containing alkaline-earth metal such as, for example, Ca and a Li, Na, or K flux. For instance, when using a mixed flux containing Na and Ca, the Ca mixed to account for about 10% of the whole allows crystals to grow under lower pressure.

EXAMPLE 3

In the present example, the description is directed to an example of the method of forming a single crystal layer by the liquid phase epitaxial growth method after the formation of a mask film and a seed layer on a sapphire substrate.

A sapphire (crystalline $Al_2O_3$) substrate was used as the base substrate while $SiN_x$ is used for the mask film. For example, silicon nitride, silicon oxide, silicon nitride oxide, aluminum oxide, aluminum nitride oxide, titanium oxide, zirconium oxide, or niobium oxide can be used for the mask film. Among them, the silicon nitride is particularly preferable since it has a function of inhibiting GaN from growing and GaN therefore does not deposit on the silicon nitride.

First, $SiN_x$ that forms the mask film was grown on the sapphire substrate by an atmospheric CVD method to have a thickness of 100 nm. Subsequently, dot-shaped openings (parts through which the sapphire substrate is exposed) were made in the mask film by photolithography and etching. The openings may be in the form of stripes.

Next, a layer of seed crystals that were expressed by a composition formula of $Al_uGa_vIn_{1-u-v}N$ (where $0 \leq u \leq 1$, $0 \leq v \leq 1$, and $u+v \leq 1$) was formed on the portions of the sapphire substrate that were not covered with the mask film, by the MOCVD method. In the present example, the sapphire substrate was heated so as to have a temperature of about 1020° C. to 1100° C. and then trimethylgallium (TMG) and $NH_3$ were supplied onto the substrate. Thus, a GaN layer was grown. The shape of the GaN layer thus grown can be varied by changing the growth temperature.

FIGS. 4A to 4C show the shapes of GaN layers that were grown at various temperatures. As shown in FIGS. 4A to 4C, when crystals are grown at 1010° C., 1040° C., and 1070° C., the GaN layer grows into a conical shape (FIG. 4A), a trapezoidal shape (FIG. 4B), and a columnar or rectangular-parallelepiped shape (FIG. 4C), respectively. In this example, the GaN layer was grown at 1070° C. and thereby columnar seed crystals were formed.

Using the GaN seed crystals thus obtained, GaN single crystals were grown by the LPE method in the same manner as in Example 1. The $SiN_x$ mask film may be left partially as long as it causes no problem in crystal growth. It, however, is preferable that the $SiN_x$ mask film is removed by dry-etching or wet-etching using hydrofluoric acid since Si serves as a n-type dopant.

Since the sapphire substrate does not melt in the GaN melt containing flux components, the GaN crystals grew selectively from the seed crystals. It was proved experimentally that when silicon (Si) or gallium arsenide (GaAs) was used for the base substrate, the base substrate melted in the GaN melt. Hence, the sapphire substrate is preferable as the base substrate that allows crystals to grow selectively. The use of a seed crystal substrate with a seed layer (a semiconductor layer) formed selectively on the base substrate that does not melt in the GaN melt such as the sapphire substrate allows GaN crystals to grow selectively. Accordingly, an excellent GaN single crystal substrate with still fewer dislocations can be obtained.

EXAMPLE 4

Figure 10:
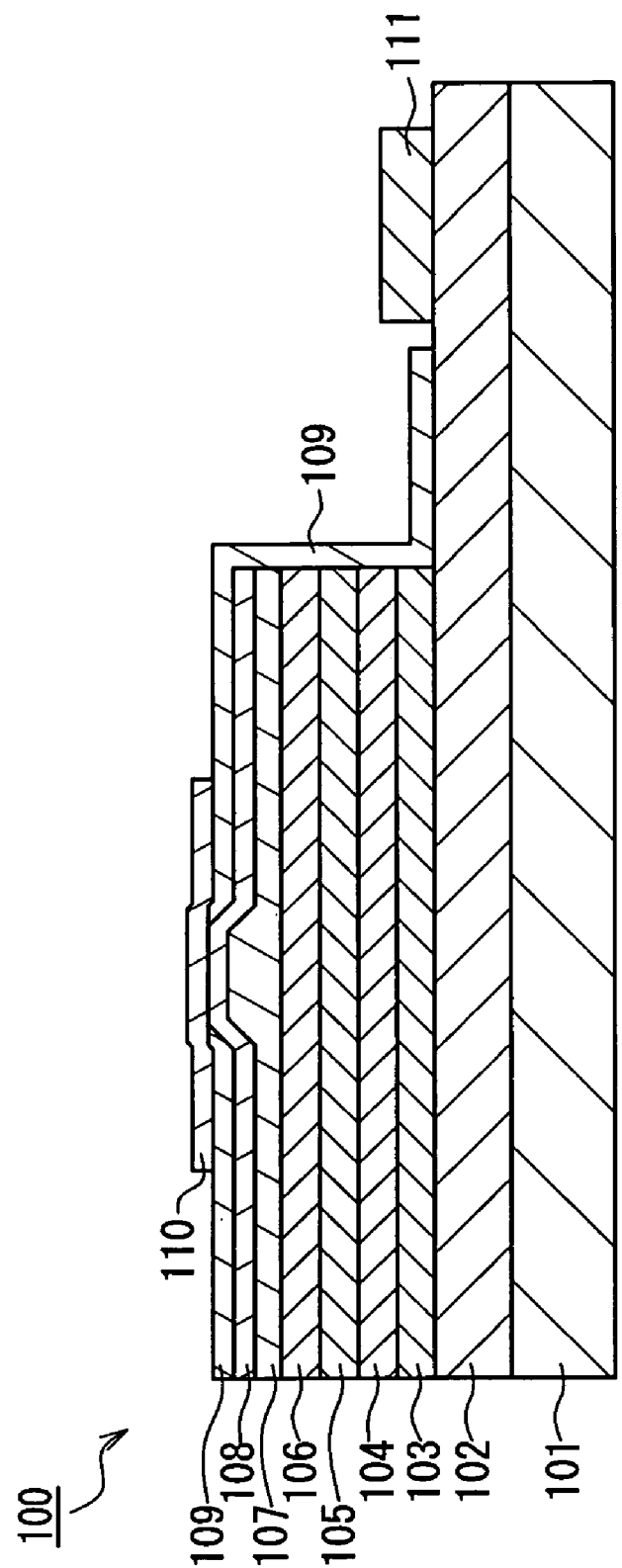
FIG. 10 is a cross-sectional view showing an example of a semiconductor device manufactured by the manufacturing method according to the present invention.

In Example 4, the description is directed to an example of manufacturing a semiconductor laser using the base substrate obtained in the example described above. The configuration of a semiconductor laser 100 is shown in FIG. 10.

First, a contact layer 102 of n-type GaN doped with Si to have a carrier density of $5 \times 10^{18}$ cm$^{-3}$ or lower was formed on a base substrate 101 formed of GaN crystals that was obtained in the above-mentioned example. The base substrate 101 was a substrate with Group III nitride crystals formed on sapphire or a substrate formed of Group III nitride crystals. In GaN-based crystals (crystals containing Ga and N), when Si was added thereto as an impurity, holes present in Ga increase in number. Since the holes present in Ga diffuse easily, they have harmful effects in terms of, for example, lifetime when a device was formed thereon. Hence, the doping amount may be controlled so that the contact layer has a carrier density of $3 \times 10^{18}$ cm$^{-3}$ or lower.

Next, a cladding layer 103 of n-type $Al_{0.07}Ga_{0.93}N$ and a light guiding layer 104 of n-type GaN were formed on the contact layer 102. Subsequently, a multiple quantum well (MQW) composed of a well layer (with a thickness of about 3 nm) made of $Ga_{0.8}In_{0.2}N$ and a barrier layer (with a thickness of about 6 nm) made of GaN is formed as an active layer 105. Thereafter, a light guiding layer 106 of p-type GaN, a cladding layer 107 of p-type $Al_{0.07}Ga_{0.93}N$, and a contact layer 108 of p-type GaN were formed sequentially on the active layer 105. These layers can be formed by well-known methods. The semiconductor laser 100 is of a double-hetero junction type. The energy gap of the well layer containing indium in the MQW active layer is smaller than those of the n-type and p-type cladding layers containing aluminum. On the other hand, the highest optical refractive index is obtained in the well layer of the active layer 105, while the light guiding layers and the cladding layers have optical refractive indices decreased in this order.

An insulating film 109 forming a current injection region having a width of about 2 μm is formed on the contact layer 108. A ridge part to serve as a current constriction part is formed in the upper portion of the p-type cladding layer 107 and the p-type contact layer 108.

A p-side electrode 110 that is in ohmic contact with the contact layer 108 is formed on the upper side of the p-type contact layer 108. An n-side electrode 111 that is in ohmic contact with the contact layer 102 is formed on the upper side of the n-type contact layer 102.

The semiconductor laser produced by the method described above was subjected to a device evaluation. When predetermined forward voltage was applied between the p-side electrode and the n-side electrode of the semiconductor laser obtained in the above, positive holes and electrons are injected into the MQW active layer from the P-side electrode and the n-side electrode, respectively. The positive holes and electrons thus injected are recombined with each other in the MQW active layer to produce optical gain, and thereby the semiconductor laser generated oscillation with an emission wavelength of 404 nm.

In the semiconductor laser of the present example, a substrate with a low dislocation density, specifically, $1 \times 10^2$ cm$^{-2}$ or lower, was used as its substrate. Accordingly, the semiconductor laser had a lower threshold electric current, improved luminous efficiency, and improved reliability as compared to one produced on a GaN substrate with a high dislocation density.

Furthermore, it also is possible to remove the sapphire portions other than the GaN crystals by grinding or the like to produce a GaN substrate and to produce a device thereon.

In the method of the aforementioned example, a C-plane $Al_xGa_{1-x}N$ (where $0 \leq x \leq 1$) substrate can be used as the seed crystal substrate. However, even when an $Al_xGa_{1-x}N$ (where $0 \leq x \leq 1$) substrate with another orientation is used as the seed crystal substrate, a single crystal substrate can be obtained that is expressed by a composition formula of $Al_xGa_{1-x}N$ (where $0 \leq x \leq 1$). For example, when a light-emitting diode is formed using the single crystal substrate obtained with an A-plane GaN substrate used as the seed crystal substrate, no piezoelectric effect is produced. Consequently, positive holes and electrons can be recombined efficiently and thereby the luminous efficiency can be improved.

Using a substrate obtained by the manufacturing method of the present invention, Group III nitride crystals are grown epitaxially on the substrate, and thereby a semiconductor device is obtained that includes a semiconductor element such as, for example, an LD or LED. The effects obtained in producing LDs and LEDs using the substrate of the present invention are as follows: since the whole substrate has a low dislocation density, wide-stripe-type LDs or plane-emission-type LDs can be provided with high reliability.

EXAMPLE 5

In the present example, the description is directed to a method in which an oxidized layer is formed on the GaN seed layer and thereby crystals are grown selectively.

Figure 11A:
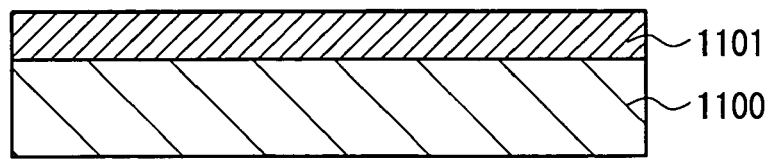
FIGS. 11A to 11E are cross-sectional views showing steps of a further example of the manufacturing method according to the present invention.

FIGS. 11A to 11E are cross-sectional views showing an example of steps of the third manufacturing method according to the present invention. First, as shown in FIG. 11A, a semiconductor layer 1101 of gallium nitride (GaN) is grown on a principal surface of a base substrate 1100 of sapphire (single crystals $Al_2O_3$) to have a thickness of about 5 μm using trimethylgallium (TMG) and ammonia ($NH_3$) as a Group III element source and a nitrogen source, respectively, by, for instance, the metalorganic chemical vapor deposition (MOCVD) method. In the present example a semiconductor layer 1101 is grown on a principal surface of a base substrate 1100. However, the semiconductor 1101 is using thick GaN crystals on a substrate such as a sapphire substrate using, for instance, the HVPE method and then separating the substrate therefrom.

Figure 11B:
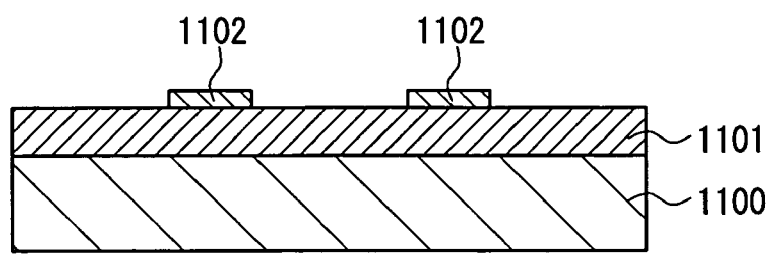

Subsequently, as shown in FIG. 11B, a mask film 1102 patterned in stripes was formed on the semiconductor layer 1101. The mask film 1102 was formed, for example, as follows. First, a mask-forming film of silicon (Si) was deposited on the semiconductor layer 1101 to have a thickness of about 100 nm by the chemical vapor deposition (CVD) method using monosilane ($SiH_4$). Thereafter, a resist pattern was formed in stripes on the mask-forming film by photolithography and then the mask-forming film was dry-etched using the resist pattern thus formed as a mask. The etching can be carried out by, for instance, a reactive ion etching (RIE) using hydrogen bromide (HBr) or chlorine gas ($Cl_2$) contained as a reactive gas. Thereafter, the resist pattern is removed by, for example, ashing. In the above, the planar shape of the mask film is a stripe shape but is not limited thereto and may be a dot shape.

Figure 11C:
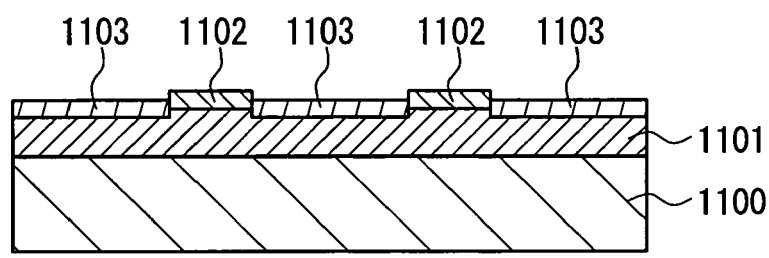
Figure 11D:
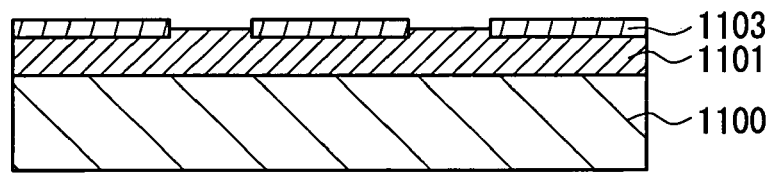

Next, the base substrate with the semiconductor layer and the mask film formed thereon was heat-treated in an oxidative atmosphere, for instance, an atmosphere containing oxygen gas ($O_2$) or water vapor ($H_2O$), at a temperature of 900° C. for four hours. In this case, gallium oxides of about 300 nm and about 40 nm were produced on the base substrate in a dry oxygen gas atmosphere and a water vapor atmosphere, respectively. With this heat treatment, as shown in FIG. 11C, oxidized regions 1103 of gallium oxide were formed on the portions of the semiconductor layer 1101 surface that were not covered with the mask film 1102. In this oxidation process, the use of the atmosphere containing oxygen gas or water vapor as the oxidative atmosphere allowed rapid and uniform oxidation to be achieved with excellent repeatability.

Next, as shown in FIG. 1D, the mask film is removed using, for instance, hydrofluoric nitric acid or the RIE method.

Figure 11E:
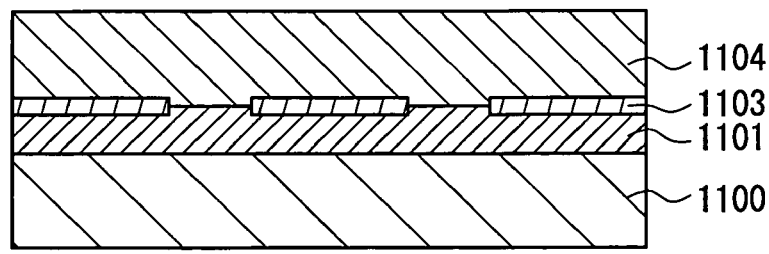

As shown in FIG. 11E, using the seed crystal substrate thus obtained, GaN crystals 1104 were grown from the semiconductor layer 1101, in a GaN melt containing a flux by the LPE method. The GaN crystals 1104 can be grown using the LPE apparatus as in the above-mentioned examples.

As in the present example, the oxidation of the GaN seed layer surface can prevent crystals from growing from the oxidized portions. That is, as shown in FIG. 1E, crystals are grown selectively from the semiconductor layer 1101 and are grown in the lateral direction on the oxidized regions 1103. As a result, crystals with fewer dislocations can be grown. The crystal growth in the lateral direction dominates on the oxidized regions 1103. Consequently, since the portions located on the oxidized regions 1103 are not affected by the dislocations caused at the surface of the semiconductor layer 1101 that serves as the seed layer, the crystal defect density of the GaN crystals grown by the LPE method can be reduced.

In the conventional method, control of dislocations is difficult and thereby the dislocations caused in the Group III nitride substrate obtained by the conventional method vary within the range of $10^4$ to $10^6$ $cm^{-2}$ depending on regions of the substrate. However, when the Group III nitride crystals are grown selectively as in the manufacturing method of the present invention, dislocations can be controlled steadily to $10^4$ $cm^{-2}$ or less in the portions formed through lateral growth of the Group III nitride crystals (i.e. the portions that are not in contact with the portions of the semiconductor layer (seed crystals) that are not covered with the mask film). Furthermore, since the GaN crystals obtained by the LPE method grow faster in the lateral direction, the cycle of oxidized regions can be increased and thereby a large area of regions with fewer dislocations can be formed. The "cycle of oxidized regions" denotes the mean value of distances between centers (center lines) of adjacent oxidized portions. The cycle can be measured with, for instance, the cross-sectional scanning electron microscope (SEM) or the cross-sectional transmission electron microscope (TEM).

In the present example, the description was directed to the oxidation of the GaN seed layer surface. However, AlGaN or AlN is easier to oxidize and therefore is favorable for growing crystals selectively. Furthermore, a method of forming an oxidized film by thermal oxidation was described in the present example. However, the similar effect can be obtained even when the oxidized film is formed by ion implantation. A photoresist material can be used as the mask material. Regarding the oxidized film, implantation of oxygen ions of $5 \times 10^{14}$ (atmos/$cm^2$) per unit area is carried out at an acceleration voltage of 150 kVe, with the center of the implantation being set at the location about 200 nm deep from the surfaces of the portions of the semiconductor layer that are not covered with the mask film, and thereby the oxidized regions can be formed selectively to be located in the portions of the semiconductor layer that are not covered with the mask film. The peak density of oxygen ions to be implanted can be, for example, $3 \times 10^{19}$ (atoms/$cm^3$). The "peak density of oxygen ions" means the maximum density of oxygen ions that can be implanted in the mask film.

EXAMPLE 6

Figure 12A:
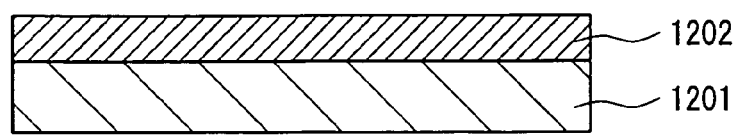
FIGS. 12A to 12D are cross-sectional views showing steps of another example of the manufacturing method according to the present invention.

FIGS. 12A to 12D are cross-sectional views showing an example of steps of the third manufacturing method according to the present invention. As shown in FIG. 12A, on a sapphire substrate 1201 made of sapphire (crystalline $Al_2O_3$), a seed layer 1202 of GaN was formed by the MOCVD method. Specifically, the sapphire substrate 1201 was heated to have a temperature of about 1020° C. to 1100° C. and then trimethylgallium (TMG) and $NH_3$ were supplied onto the base substrate. Thus, the seed layer 1202 of GaN was formed. In this case, the Group III element of the seed layer 1202 is not limited to gallium but may be aluminum or indium. That is, the seed layer 1202 may be any layer as long as it is formed of semiconductor crystals that are expressed by a composition formula of $Al_uGa_vIn_{1-u-v}N$ (where $0 \leq u \leq 1$ and $0 \leq v \leq 1$).

Figure 12B:
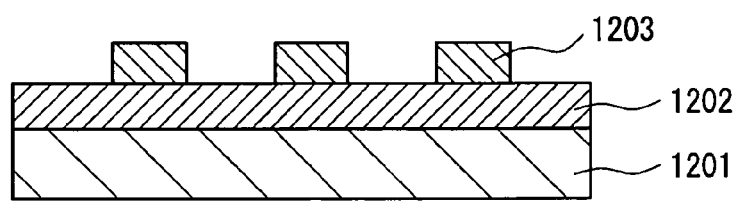
Figure 12C:
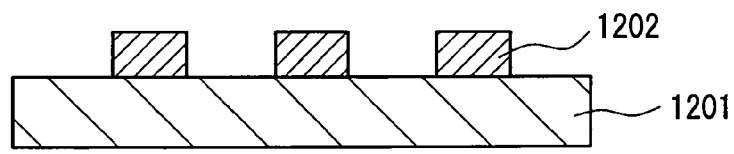

Next, as shown in FIG. 12B, the seed layer 1202 was etched partially up to the sapphire substrate to form stripe-like convex portions. Specifically, after a resist film (a mask film) was applied to the upper surface of the seed layer 1202, the resist film 1203 thus applied was patterned into stripes by the photolithography method to form a resist pattern. Subsequently, with the resist pattern serving as a mask, the seed layer 1202 was dry-etched. Thus, as shown in FIG. 12C, convex portions having a width of about 5 μm were formed at a cycle of about 300 μm. In the present example, the convex portions each are formed of a stripe structure. However, there is no problem even if the convex portions have another structure. For instance, a dot-like structure may be provided as an in-plane structure.

Figure 12D:
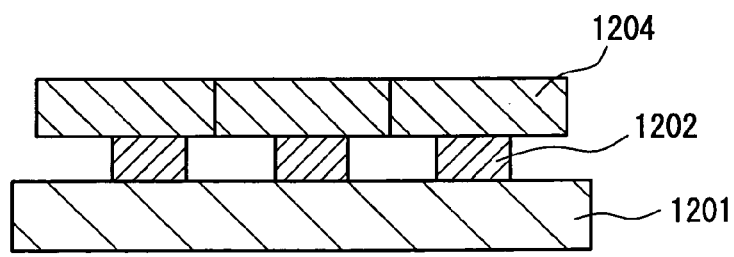

Next, as shown in FIG. 12D, LPE-GaN crystals 1204 of GaN crystals were grown through liquid phase growth, with the upper surfaces of the convex portions serving as seed crystals. The liquid phase growth was carried out using the LPE apparatus shown in FIG. 8. Sodium and gallium were weighed and then were placed inside the crucible into which a template shown in FIG. 12C was put. Crystals were grown in a pressurized nitrogen atmosphere of 50 atm (50×1.013× $10^5$ Pa) at 800° C. for 100 hours. Consequently, the LPE-GaN crystals shown in FIG. 12D were grown. In the liquid phase growth, since the growth rate in the lateral direction was higher, the LPE-GaN crystals that grew from two adjacent convex portions coalesced as shown in FIG. 12D.

In the LPE-GaN crystals obtained in the present example, many dislocations were observed in their portions located on the convex portions and in their coalescence portions, but fewer dislocations were observed in the other portions. In the present invention, since the cycle of the convex portions is 300 μm, a large area with fewer dislocations, specifically, at least 100 μm, can be obtained. Accordingly, when, for example, a semiconductor laser is to be manufactured, the precision required in mask alignment carried out for forming a waveguide can be eased. In addition, a waveguide of a wide stripe required for a high-power semiconductor laser can be formed. Hence, great practical effects are provided.

In the above, the embodiments of the present invention are described by means of the examples. However, the present invention is not limited to the embodiments described above and can be applied to other embodiments according to the technical concept of the present invention.

As described above, the method of manufacturing a semiconductor substrate according to the present invention enables easy manufacture of substrates with Group III nitride crystals having excellent characteristics. Furthermore, with the use of this semiconductor substrate, semiconductor devices with excellent characteristics can be obtained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a Group III nitride substrate comprising:
   (i) preparing a Group III nitride semiconductor layer that is expressed by a composition formula of $Al_uGa_vIn_{1-u-v}N$ (where $0 \leq u \leq 1$, $0 \leq v \leq 1$, and $u+v \leq 1$);
   (ii) forming a patterned mask film on the Group III nitride semiconductor layer; and
   (iii) in an atmosphere including nitrogen, bringing a surface of the Group III nitride semiconductor layer whose surface is partially exposed into contact with a melt containing the nitrogen, alkali metal, and at least one Group III element selected from the group consisting of gallium, aluminum, and indium, and thereby generating or growing Group III nitride crystals on the Group III nitride semiconductor layer, with portions of the Group III nitride semiconductor layer that are not covered with the mask film serving as seed crystals.

2. The method of manufacturing a Group III nitride substrate according to claim 1, wherein the mask film comprises diamond-like carbon.

3. The method of manufacturing a Group III nitride substrate according to claim 1, wherein the mask film is expressed by a composition formula of $Al_uGa_{1-u}N$ (where $0 \leq u \leq 1$).

4. The method of manufacturing a Group III nitride substrate according to claim 1, wherein a composition ratio of Al contained in the mask film is higher than that of Al contained in the Group III nitride semiconductor layer.

5. The method of manufacturing a Group III nitride substrate according to claim 4, wherein a surface of the mask film or the mask film as a whole has been oxidized.

6. The method of manufacturing a Group III nitride substrate according to claim 1, wherein the process (i) comprises:
   forming, on a base substrate, a Group III nitride semiconductor layer that is expressed by a composition formula of $Al_uGa_vIn_{1-u-v}N$ (where $0 \leq u \leq 1$, $0 \leq v \leq 1$, and $u+v \leq 1$).

7. The method of manufacturing a Group III nitride substrate according to claim 1, wherein the Group III nitride semiconductor layer is formed using GaN, and the mask film is expressed by a composition formula of $Al_uGa_{1-u}N$ (where $0.05 \leq u \leq 1$).

8. The method of manufacturing a Group III nitride substrate according to claim 1, wherein the mask film has a plurality of through holes formed therein, the portions of the Group III nitride semiconductor layer are exposed through the through holes.

9. The method of manufacturing a Group III nitride substrate according to claim 1, wherein the mask film is patterned into stripes, and thereby stripe-like portions of the Group III nitride semiconductor layer are exposed.

10. The method of manufacturing a Group III nitride substrate according to claim 1, wherein the mask film is formed using Al, and a surface of the mask film or the mask film as a whole has been oxidized.

11. A method of manufacturing a Group III nitride substrate comprising:
   (I) forming a patterned mask film on a base substrate;
   (II) forming a Group III nitride semiconductor layer on portions of the base substrate that are not covered with the mask film, the Group III nitride semiconductor layer being expressed by a composition formula of $Al_uGa_vIn_{1-u-v}N$ (where $0 \leq u \leq 1$, $0 \leq v \leq 1$, and $u+v \leq 1$); and
   (III) in an atmosphere including nitrogen, bringing a surface of the Group III nitride semiconductor layer whose surface is partially exposed into contact with a melt containing the nitrogen, alkali metal, and at least one Group III element selected from the group consisting of gallium, aluminum, and indium, and thereby generating or growing Group III nitride crystals on the Group III nitride semiconductor layer, with the Group III nitride semiconductor layer serving as seed crystals.

12. The method of manufacturing a Group III nitride substrate according to claim 11, wherein the mask film has a plurality of through holes formed therein, the portions of the Group III nitride semiconductor layer are exposed through the through holes.

13. The method of manufacturing a Group III nitride substrate according to claim 11, wherein the mask film is patterned into stripes, and thereby stripe-like portions of the Group III nitride semiconductor layer are exposed.

14. The method of manufacturing a Group III nitride substrate according to claim 11, wherein the mask film comprises at least one selected from the group consisting of silicon nitride, silicon oxide, silicon nitride oxide, aluminum oxide, and aluminum nitride oxide.

15. The method of manufacturing a Group III nitride substrate according to claim 11, wherein the mask film comprises at least one of high melting metal or a high melting metallized material.

16. The method of manufacturing a Group III nitride substrate according to claim 11, wherein the mask film comprises at least one selected from the group consisting of titanium, tungsten, molybdenum, niobium, tungsten silicide, molybdenum silicide, and niobium silicide.

17. A method of manufacturing a Group III nitride substrate comprising:
  (A) preparing a Group III nitride semiconductor layer that is expressed by a composition formula of $Al_uGa_vIn_{1-u-v}N$ (where $0 \leq u \leq 1$, $0 \leq v \leq 1$, and $u+v \leq 1$);
  (B) oxidizing portions of a surface of the Group III nitride semiconductor layer to form oxidized regions; and
  (C) in an atmosphere including nitrogen, bringing the surface of the Group III nitride semiconductor layer whose surface is partially exposed into contact with a melt containing the nitrogen, alkali metal, and at least one Group III element selected from the group consisting of gallium, aluminum, and indium, and thereby generating or growing Group III nitride crystals on the Group III nitride semiconductor layer, with portions other than the oxidized regions of the Group III nitride semiconductor layer serving as seed crystals.

18. The method of manufacturing a Group III nitride substrate according to claim 17, wherein the process (A) comprises:
  forming, on a base substrate, a Group III nitride semiconductor layer that is expressed by a composition formula of $Al_uGa_vIn_{1-u-v}N$ (where $0 \leq u \leq 1$, $0 \leq v \leq 1$, and $u+v \leq 1$).

19. The method of manufacturing a Group III nitride substrate according to claim 17, wherein the process (B) comprises:
  (B-1) forming a patterned mask film on the surface of the Group III nitride semiconductor layer;
  (B-2) oxidizing portions of the surface of the Group III nitride semiconductor layer to form the oxidized regions, the portions being not covered with the mask film.

20. The method of manufacturing a Group III nitride substrate according to claim 19, wherein the process (B-2) comprises:
  implanting oxygen in the portions of the surface of the Group III nitride semiconductor layer to form the oxidized regions, the portions being not covered with the mask film.

21. The method of manufacturing a Group III nitride substrate according to claim 19, wherein the mask film has a plurality of through holes formed therein, the portions of the Group III nitride semiconductor layer are exposed through the through holes.

22. The method of manufacturing a Group III nitride substrate according to claim 19, wherein the mask film is patterned into stripes, and thereby stripe-like portions of the Group III nitride semiconductor layer are exposed.

23. The method of manufacturing a Group III nitride substrate according to claim 19, comprising the step of removing the mask film.

24. A method of manufacturing a Group III nitride substrate comprising:

(a) forming, on a base substrate, a Group III nitride semiconductor layer that is expressed by a composition formula of $Al_uGa_vIn_{1-u-v}N$ (where $0 \leq u \leq 1$, $0 \leq v \leq 1$, and $u+v \leq 1$);
  (b) forming a patterned mask film on the Group III nitride semiconductor layer, removing portions of the Group III nitride semiconductor layer located in regions that are not covered with the mask film, to expose portions of the base substrate and to form seed semiconductor layers with a convex shape that are covered with the mask film; and
  (c) in an atmosphere including nitrogen, bringing surfaces of the seed semiconductor layers whose surface is partially exposed into contact with a melt containing the nitrogen, alkali metal, and at least one Group III element selected from the group consisting of gallium, aluminum, and indium, and thereby generating or growing Group III nitride crystals on the Group III nitride semiconductor layer, with the seed semiconductor layers serving as seed crystals.

25. The method of manufacturing a Group III nitride substrate according to claim 24, wherein the base substrate is a sapphire substrate whose surface is a (0001) plane.

26. The method of manufacturing a Group III nitride substrate according to claim 24, wherein the mask film has a plurality of through holes formed therein, the portions of the Group III nitride semiconductor layer are exposed through the through holes.

27. The method of manufacturing a Group III nitride substrate according to claim 24, wherein the mask film is patterned into stripes, and thereby stripe-like portions of the Group III nitride semiconductor layer are exposed.

28. The method of manufacturing a Group III nitride substrate according to claim 24, comprising the step of removing the mask film.

29. The method of manufacturing a Group III nitride substrate according to claim 1, wherein the Group III element is gallium, and the Group III nitride crystals are crystals of gallium nitride.

30. The method of manufacturing a Group III nitride substrate according to claim 1, wherein the atmosphere is a pressurized atmosphere.

31. The method of manufacturing a Group III nitride substrate according to claim 1, wherein the melt further comprises alkaline-earth metal.

32. The method of manufacturing a Group III nitride substrate according to claim 1, wherein the Group III nitride crystals are grown while the seed crystals are rocked in the melt.

33. The method of manufacturing a Group III nitride substrate according to claim 1, wherein a cycle of exposed portions selected as seed crystals is at least 30 μm.

34. The method of manufacturing a Group III nitride substrate according to claim 1, wherein a cycle of exposed portions selected as seed crystals is at least 50 μm.

35. The method of manufacturing a Group III nitride substrate according to claim 1, wherein a cycle of exposed portions selected as seed crystals is at least 100 μm.

36. The method of manufacturing a Group III nitride substrate according to claim 1, wherein a cycle of exposed portions selected as seed crystals is at least 1000 μm.

37. A Group III nitride substrate that is manufactured by a manufacturing method according to claim 1, wherein the Group III nitride substrate comprises:

a Group III nitride semiconductor layer whose surface had been formed as a patterned mask film and had been partially exposed to provide a plurality of exposed portions; and a Group III nitride crystal layer grown selectively from the exposed portions.

38. The Group III nitride substrate according to claim 37, wherein a cycle of dense dislocation areas is at least 30 μm.

39. The Group III nitride substrate according to claim 37, wherein a cycle of dense dislocation areas is at least 50 μm.

40. The Group III nitride substrate according to claim 37, wherein a cycle of dense dislocation areas is at least 100 μm.

41. The Group III nitride substrate according to claim 37, wherein a cycle of dense dislocation areas is at least 1000 μm.

42. The Group III nitride substrate according to claim 37, comprising:

a Group III nitride semiconductor layer having oxidized regions; and

Group III nitride crystals formed on the Group III nitride semiconductor layer through liquid phase growth, wherein the oxidized regions are the oxidized regions formed in the portions by the process (B) according to claim 17.

43. The Group III nitride substrate according to claim 37, comprising:

a Group III nitride semiconductor layer including at least one of a region formed of AlGaN and a region formed of AlN; and Group III nitride crystals formed on the Group III nitride semiconductor layer through liquid phase growth.

44. The Group III nitride substrate according to claim 37, comprising:

a Group III nitride semiconductor layer including diamond-like carbon; and

Group III nitride crystals formed on the Group III nitride semiconductor layer through liquid phase growth.

45. A semiconductor device, comprising:

a substrate; and a semiconductor element formed on the substrate, wherein the substrate is a Group III nitride substrate according to claim 37.

46. The semiconductor device according to claim 45, wherein the semiconductor element is a laser diode or a light emitting diode.

47. The method of manufacturing a Group III nitride substrate according to claim 11, wherein the Group III element is gallium, and the Group III nitride crystals are crystals of gallium nitride.

48. The method of manufacturing a Group III nitride substrate according to claim 11, wherein the atmosphere is a pressurized atmosphere.

49. The method of manufacturing a Group III nitride substrate according to claim 11, wherein the melt further comprises alkaline-earth metal.

50. The method of manufacturing a Group III nitride substrate according to claim 11, wherein the Group III nitride crystals are grown while the seed crystals are rocked in the melt.

51. The method of manufacturing a Group III nitride substrate according to claim 17, wherein the Group III element is gallium, and the Group III nitride crystals are crystals of gallium nitride.

52. The method of manufacturing a Group III nitride substrate according to claim 17, wherein the atmosphere is a pressurized atmosphere.

53. The method of manufacturing a Group III nitride substrate according to claim 17, wherein the melt further comprises alkaline-earth metal.

54. The method of manufacturing a Group III nitride substrate according to claim 17, wherein the Group III nitride crystals are grown while the seed crystals are rocked in the melt.

55. The method of manufacturing a Group III nitride substrate according to claim 24, wherein the Group III element is gallium, and the Group III nitride crystals are crystals of gallium nitride.

56. The method of manufacturing a Group III nitride substrate according to claim 24, wherein the atmosphere is a pressurized atmosphere.

57. The method of manufacturing a Group III nitride substrate according to claim 24, wherein the melt further comprises alkaline-earth metal.

58. The method of manufacturing a Group III nitride substrate according to claim 24, wherein the Group III nitride crystals are grown while the seed crystals are rocked in the melt.

* * * * *